(12) United States Patent
Park et al.

(10) Patent No.: US 9,166,365 B2
(45) Date of Patent: Oct. 20, 2015

(54) HOMOGENIZATION OF FAR FIELD FIBER COUPLED RADIATION

(75) Inventors: Sang-Ki Park, Tucson, AZ (US);
Edmund L. Wolak, Tucson, AZ (US);
John K. Johnson, Tucson, AZ (US);
Serge Cutillas, Tucson, AZ (US)

(73) Assignee: II-VI LASER ENTERPRISE GMBH, Zurich (CH)

( * ) Notice: Subject to any disclaimer, the term of this patent is extended or adjusted under 35 U.S.C. 154(b) by 119 days.

(21) Appl. No.: 13/522,692

(22) PCT Filed: Jan. 20, 2011

(86) PCT No.: PCT/US2011/021931
§ 371 (c)(1),
(2), (4) Date: Nov. 14, 2012

(87) PCT Pub. No.: WO2011/091170
PCT Pub. Date: Jul. 28, 2011

(65) Prior Publication Data
US 2013/0058124 A1    Mar. 7, 2013

Related U.S. Application Data

(60) Provisional application No. 61/297,700, filed on Jan. 22, 2010.

(51) Int. Cl.
*D03D 15/00* (2006.01)
*F21V 7/04* (2006.01)
(Continued)

(52) U.S. Cl.
CPC ............ *H01S 5/02284* (2013.01); *G02B 6/262* (2013.01); *G02B 6/32* (2013.01); *H01S 5/005* (2013.01); *H01S 5/4012* (2013.01)

(58) Field of Classification Search
CPC ............ G02B 6/32; G02B 6/26; G02B 6/262; G02B 6/02214; G02B 13/14; H01S 5/02284; H01S 5/005; H01S 5/4012
USPC ............... 362/551, 583, 558, 553–556; 372/6
See application file for complete search history.

(56) References Cited

U.S. PATENT DOCUMENTS 4,428,647 A    1/1984 Sprague
4,535,773 A    8/1985 Yoon
(Continued)

FOREIGN PATENT DOCUMENTS

CN          1611969        5/2005
DE    10 2004 006932     10/2005
(Continued)

OTHER PUBLICATIONS

Andersen et al., "High Repetition Rate Tunable Femtosecond Pulses from Fiber Laser Pumped Parametric Amplifier," Advanced Solid-State Photonics, ME2, Abstract of Talk 4:30pm Jan. 30, 2006.
(Continued)

*Primary Examiner* — Jason Moon Han
(74) *Attorney, Agent, or Firm* — Anderson IP, Inc.

(57) ABSTRACT

Optical systems and components thereof are disclosed which may be used for efficiently coupling laser energy into an optical conduit while maintaining a homogenous beam output from the optical conduit. Some embodiments are directed more specifically to far field beam homogenization of optical fiber coupled radiation.

74 Claims, 11 Drawing Sheets

(51) Int. Cl.
*G02B 6/44* (2006.01)
*G09F 13/18* (2006.01)
*H01S 5/022* (2006.01)
*G02B 6/26* (2006.01)
*G02B 6/32* (2006.01)
*H01S 5/00* (2006.01)
*H01S 5/40* (2006.01)

(56) References Cited

U.S. PATENT DOCUMENTS

| | | | |
|---|---|---|---|
| 4,763,975 A * | 8/1988 | Scifres et al. | 385/33 |
| 4,910,539 A | 3/1990 | Mathis et al. | |
| 5,049,981 A | 9/1991 | Dahringer | |
| 5,127,068 A | 6/1992 | Baer | |
| 5,144,486 A | 9/1992 | Hart | |
| 5,168,401 A | 12/1992 | Endriz | |
| 5,230,969 A | 7/1993 | Savant et al. | |
| 5,243,619 A | 9/1993 | Albers et al. | |
| 5,334,150 A | 8/1994 | Kaali | |
| 5,365,366 A | 11/1994 | Kafka et al. | |
| 5,367,529 A | 11/1994 | Holsinger et al. | |
| 5,381,859 A | 1/1995 | Minakami et al. | |
| 5,446,749 A | 8/1995 | Nighan et al. | |
| 5,513,201 A | 4/1996 | Yamaguchi | |
| 5,562,696 A | 10/1996 | Nobles et al. | |
| 5,579,422 A | 11/1996 | Head et al. | |
| 5,691,989 A | 11/1997 | Rakuljic et al. | |
| 5,740,288 A | 4/1998 | Pan | |
| 5,740,292 A | 4/1998 | Strasser | |
| 5,787,107 A | 7/1998 | Leger | |
| 5,808,323 A | 9/1998 | Spaeth | |
| 5,825,551 A | 10/1998 | Clarkson | |
| 5,832,150 A | 11/1998 | Flint | |
| 5,848,083 A | 12/1998 | Haden et al. | |
| 5,986,794 A | 11/1999 | Krause | |
| 5,993,073 A | 11/1999 | Hamakawa et al. | |
| 5,999,544 A | 12/1999 | Petersen | |
| 6,044,096 A | 3/2000 | Wolak et al. | |
| 6,064,515 A | 5/2000 | Yang | |
| 6,084,895 A | 7/2000 | Kouchi et al. | |
| 6,107,113 A | 8/2000 | Harmand et al. | |
| 6,160,664 A | 12/2000 | Du et al. | |
| 6,175,452 B1 | 1/2001 | Ullmann et al. | |
| 6,185,235 B1 | 2/2001 | Cheng et al. | |
| 6,215,598 B1 | 4/2001 | Hwu | |
| 6,314,116 B1 | 11/2001 | Wright et al. | |
| 6,324,326 B1 | 11/2001 | Dejneka et al. | |
| 6,331,692 B1 | 12/2001 | Krause et al. | |
| 6,335,822 B1 | 1/2002 | Toyohara | |
| 6,337,873 B1 | 1/2002 | Goering et al. | |
| 6,356,380 B1 | 3/2002 | Whitney | |
| 6,356,577 B1 | 3/2002 | Miller | |
| 6,384,896 B1 | 5/2002 | Tatsukuki | |
| 6,389,198 B2 | 5/2002 | Kafka et al. | |
| 6,396,857 B1 | 5/2002 | Labranche et al. | |
| 6,428,217 B1 | 8/2002 | Giltner | |
| 6,448,801 B2 | 9/2002 | Dischiano | |
| 6,493,148 B1 | 12/2002 | Anikitchev | |
| 6,504,858 B2 | 1/2003 | Cheng et al. | |
| 6,516,011 B1 | 2/2003 | Treusch | |
| 6,559,879 B1 | 5/2003 | Kobayashi et al. | |
| 6,594,092 B2 | 7/2003 | von Freyhold et al. | |
| 6,600,605 B1 | 7/2003 | Anikitchev | |
| 6,643,302 B1 | 11/2003 | Nishikawa et al. | |
| 6,736,554 B2 | 5/2004 | Kerboeuf et al. | |
| 6,768,593 B1 * | 7/2004 | Jutamulia | 359/641 |
| 6,771,686 B1 | 8/2004 | Ullman et al. | |
| 6,778,732 B1 | 8/2004 | Fermann | |
| 6,804,277 B2 | 10/2004 | Kimura et al. | |
| 6,822,978 B2 | 11/2004 | Kafka et al. | |
| 6,831,778 B2 | 12/2004 | Yang et al. | |
| 6,876,784 B2 | 4/2005 | Nikolov et al. | |
| 6,882,664 B2 | 4/2005 | Bolshtyansky et al. | |
| 6,888,679 B2 | 5/2005 | Brown | |
| 6,891,876 B2 | 5/2005 | Sutter et al. | |
| 6,897,486 B2 | 5/2005 | Loh | |
| 6,898,231 B2 | 5/2005 | Butterworth | |
| 6,919,990 B2 | 7/2005 | Anikitchev et al. | |
| 6,922,288 B2 | 7/2005 | Yamanaka et al. | |
| 6,922,419 B1 | 7/2005 | Nighan et al. | |
| 6,931,037 B2 | 8/2005 | Nighan et al. | |
| 6,969,206 B2 | 11/2005 | Iwanaga et al. | |
| 6,977,769 B2 | 12/2005 | Matsushita et al. | |
| 6,985,648 B2 | 1/2006 | Kish et al. | |
| 6,993,059 B2 | 1/2006 | Anikitchev et al. | |
| 7,006,194 B2 | 2/2006 | Sumiyoshi et al. | |
| 7,006,549 B2 | 2/2006 | Anikitchev et al. | |
| 7,010,194 B2 | 3/2006 | Anikitchev et al. | |
| 7,027,228 B2 | 4/2006 | Mikhalov | |
| 7,065,105 B2 | 6/2006 | Ehlers et al. | |
| 7,244,965 B2 | 7/2007 | Andrews et al. | |
| 7,259,907 B2 | 8/2007 | Langhans | |
| 7,322,754 B2 | 1/2008 | Wolf et al. | |
| 7,372,879 B2 | 5/2008 | Giaretta et al. | |
| 7,379,237 B1 | 5/2008 | Di Teodoro et al. | |
| 7,830,608 B2 | 11/2010 | Hu et al. | |
| 7,866,897 B2 | 1/2011 | Hu et al. | |
| 8,644,357 B2 | 2/2014 | Liu et al. | |
| 2002/0030200 A1 | 3/2002 | Yamaguchi et al. | |
| 2002/0037142 A1 | 3/2002 | Rossi | |
| 2002/0172475 A1 | 11/2002 | Miyazaki et al. | |
| 2003/0044132 A1 | 3/2003 | Nasu et al. | |
| 2003/0048987 A1 * | 3/2003 | Saito et al. | 385/33 |
| 2003/0161357 A1 | 8/2003 | Bolshtyansky et al. | |
| 2004/0095983 A1 | 5/2004 | Whitley | |
| 2004/0114860 A1 * | 6/2004 | Dultz et al. | 385/31 |
| 2004/0151431 A1 * | 8/2004 | Ukrainczyk | 385/33 |
| 2004/0184753 A1 | 9/2004 | Teramura et al. | |
| 2004/0213305 A1 | 10/2004 | Nakae et al. | |
| 2004/0252744 A1 | 12/2004 | Anikitchev et al. | |
| 2004/0258117 A1 | 12/2004 | Nebel et al. | |
| 2005/0018743 A1 | 1/2005 | Volodin et al. | |
| 2005/0069255 A1 | 3/2005 | Nishimura et al. | |
| 2005/0105189 A1 | 5/2005 | Mikhailov | |
| 2005/0207454 A1 | 9/2005 | Starodoumov et al. | |
| 2005/0248819 A1 | 11/2005 | Hymel et al. | |
| 2005/0248820 A1 | 11/2005 | Moser et al. | |
| 2005/0257917 A1 | 11/2005 | East et al. | |
| 2006/0018609 A1 | 1/2006 | Sonoda et al. | |
| 2006/0039418 A1 | 2/2006 | Anikitchev et al. | |
| 2006/0045143 A1 | 3/2006 | Anikitchev et al. | |
| 2006/0114955 A1 | 6/2006 | Steckman | |
| 2006/0126690 A1 | 6/2006 | Kido et al. | |
| 2006/0147158 A1 | 7/2006 | Sato | |
| 2006/0176912 A1 | 8/2006 | Anikitchev | |
| 2006/0263004 A1 | 11/2006 | Klimek et al. | |
| 2006/0274797 A1 | 12/2006 | Myers et al. | |
| 2006/0280209 A1 | 12/2006 | Treusch et al. | |
| 2007/0024959 A1 | 2/2007 | Peterson | |
| 2007/0075465 A1 | 4/2007 | Taylor et al. | |
| 2007/0223862 A1 | 9/2007 | Thyzel | |
| 2007/0263684 A1 | 11/2007 | Nolan | |
| 2007/0268571 A1 | 11/2007 | Hu et al. | |
| 2007/0268572 A1 | 11/2007 | Hu et al. | |
| 2007/0291373 A1 | 12/2007 | Hu et al. | |
| 2007/0291813 A1 | 12/2007 | Hu et al. | |
| 2008/0008216 A1 | 1/2008 | Miller et al. | |
| 2008/0008217 A1 | 1/2008 | Miller et al. | |
| 2008/0101429 A1 * | 5/2008 | Sipes | 372/50.12 |
| 2009/0104727 A1 | 4/2009 | Krejci et al. | |
| 2009/0115833 A1 | 5/2009 | Soulliaert et al. | |
| 2009/0251697 A1 | 10/2009 | Cutillas et al. | |
| 2009/0323175 A1 | 12/2009 | Mukai et al. | |
| 2010/0177796 A1 | 7/2010 | Miller | |
| 2011/0051758 A1 | 3/2011 | Krejci et al. | |
| 2012/0177074 A1 | 7/2012 | Liu et al. | |

FOREIGN PATENT DOCUMENTS

| | | |
|---|---|---|
| EP | 1 298 460 | 4/2003 |
| JP | 05-004112 | 1/1993 |
| JP | 09-159880 | 6/1997 |
| JP | 411233857 | 8/1999 |

(56) References Cited

FOREIGN PATENT DOCUMENTS

| | | |
|---|---|---|
| JP | 2001-82269 | 3/2001 |
| JP | 2001-343561 | 12/2001 |
| JP | 2002-148491 | 5/2002 |
| JP | 2003-131083 | 5/2003 |
| JP | 2003-198051 | 7/2003 |
| JP | 2004-022679 | 1/2004 |
| JP | 2004-096009 | 3/2004 |
| JP | 2005-134916 | 5/2005 |
| JP | 2005-167041 | 6/2005 |
| JP | 2006-032352 | 2/2006 |
| JP | 2006-171348 | 6/2006 |
| JP | 2007-149932 | 6/2007 |
| JP | 2007-528509 | 10/2007 |
| JP | 2007-298933 | 11/2007 |
| JP | 2007-300015 | 11/2007 |
| JP | 2009-503596 | 1/2009 |
| JP | 2010-175579 | 8/2010 |
| JP | 2011-520292 | 7/2011 |
| WO | WO 99/49343 | 3/1999 |
| WO | WO-02/077698 | 10/2002 |
| WO | WO 2007/137005 | 11/2007 |
| WO | WO 2009/037555 | 3/2009 |
| WO | WO 2009/079567 | 7/2009 |
| WO | WO 2009/137703 | 11/2009 |
| WO | WO 2010/081092 | 7/2010 |
| WO | WO 2010/118290 | 10/2010 |
| WO | WO 2011/091170 | 7/2011 |

OTHER PUBLICATIONS

Becht, Vector phase conjugation for beam combining in a pulsed Nd:YAG laser system, Proceedings of the SPIE—The International Society for Optical Engineering, 3263:11-19 (1998).

Brunner et al., "Powerful red-green-blue laser source pumped with a mode-locked thin disk laser," Optics Letters 29(16):1921-1923, Aug. 15, 2004.

Fuhr, Polarization power summing in laser diode communication systems, SPIE 740:70-76 (1987).

Ghislotti et al., Bidirectional Pumping of Er-Doped Fibers Using Detuned 980-nm Lasers, IEEE Photonics Technology Letters 14(5):780-782 2002.

Headley et al., Tapered Fiber bundles for combining laser pumps., Proceedings of the SPIE —The International Society for Optical Engineering, 5709(1):263-272 (200).

Knitsch et al., Diode Laser Modules of Highest Brilliance for Materials Processing, Proceedings of the SPIE, vol. 4651:256-263 (2002).

Kruglov et al., "Self-similar propagation of parabolic pulses in normal-dispersion fiber amplifiers," JOSA B, 19(3):461-469 2002.

Mecherle, Laser diode combining for free space optical communication, Proceedings of the SPIE—The International Society for Optical Engineering, 616:281-291 (1986).

Miyajima et al., Single Wavelength 5.6 Direct Diode Laser with a High-Efficiency Beam Combination, Jpn. J. Appl. Phys., 43(8):5269-5272 (2004).

Moser et al., "Volume Bragg Grating Devices," Friday Morning Optical Fiber Communications Conference, 2003, OFC 2003 pp. 644-645, vol. 2, Mar. 28, 2003.

Ondax, Inc., "Volume Holographic Gratings (VHG)," 2005 pp. 1-7.

Piper et al., 1.2 mJ, 37 ns single-moded pulses at 10kHz repetition rate from a Q-switched ytterbium fiber Laser, Abstract, In, Proceedings of CLEO/IQEC May 16-21, 2004: Conference on Lasers and Electro-Optics, Quantum Electronics and Laser Science. USA, Institute of Electrical and Electronics Engineers.

Rothenberg, Polarization beam smoothing for ineertial confinement fusion, J. Applied Physics, 87(8):3654-3662 (2000).

Sincerbox, Laser Beam Combining, IBM Technical Disclosure Bulletin, 12(10):1663-1664 (1970).

Steinmann et al., "Tunable fs Laser Pulses from OPA with MHz Repetition Rate," Advanced Solid-State Photonics, TuC6, Abstract of Talk, 12:30pm Jan. 31, 2006.

Thestrup et al, High brightness laser source based on polarization coupling of two diode lasers with asymmetric feedback, Applied Physics Letters, 82(5):680-682 (2003).

Tra Fiberoptics, Inc. High-Powered SMA Connectors for Photonic Crystal Fiber. TraTech Fiberoptic, Inc. Brochure; 2004.

Treusch et al., High-Brightness Semiconductor Laser Sources for Materials Processing: Stacking, Beam Shaping, and Bars, IEEE Journal of Selected Topics in Quantum Electronics, 6(4):601-614 (2000).

Valdor Fiber Optics Catalog #910-00001, pp. 1-2 Impact Mount Singlemode Laser Pigtails, Printed from the internet: Dec. 22, 2006.

Volodin et al., Wavelength Stabilization and spectrum narrowing of high-power multimode laser diodes and arrays by use of volume Bragg gratings. Optics Letters 29(16): Aug. 15, 2004.

International Search Report and Written Opinion mailed on: Nov. 26, 2007 for International Application No. PCT/US2007/069717 filed on: May 10, 2007 and published as: WO/2007/137005 on: Nov. 29, 2007.

International Search Report and Written Opinion mailed on Jul. 24, 2009 for International Application No. PCT/US2008/087198 filed on: Dec. 17, 2008 and published as: WO/2009/079567 on: Jun. 25, 2009.

International Search Report and Written Opinion mailed on Dec. 28, 2009 for International Application No. PCT/US2009/043182 filed on: May 7, 2009 and published as: WO/2009/137703 on: Nov. 12, 2009.

International Search Report and Written Opinion mailed on Sep. 30, 2011 for International Application No. PCT/US2011/021931 filed on: Jan. 20, 2011 and published as: WO/2011/091170 on: Jul. 28, 2011.

International Search Report and Written Opinion mailed on Mar. 17, 2010 for International Application No. PCT/US2010/020647 filed on: Jan. 11, 2010 and published as: WO/2010/081092 on: Jul. 15, 2010.

International Search Report and Written Opinion mailed on Jun. 7, 2010 for International Application No. PCT/US2010/030486 filed on: Apr. 9, 2010 and published as: WO/2010/118290 on: Oct. 14, 2010.

Office Action mailed on Jul. 16, 2010 for U.S. Appl. No. 11/747,172, filed May 10, 2007 published as: US 2007/0268571 A1 on Nov. 22, 2007, issued as: 7,830,608 on Nov. 9, 2010.

Office Action mailed on Dec. 15, 2009 for U.S. Appl. No. 11/747,172, filed May 10, 2007 published as: US 2007/0268571 A1 on Nov. 22, 2007issued as: 7,830,608 on Nov. 9, 2010.

Office Action mailed on Jul. 24, 2009 for U.S. Appl. No. 11/747,172, filed May 10, 2007 published as: US 2007/0268571 A1 on Nov. 22, 2007issued as: 7,830,608 on Nov. 9, 2010.

Office Action mailed on Jan. 23, 2009 for U.S. Appl. No. 11/747,172, filed May 10, 2007 published as: US 2007/0268571 A1 on Nov. 22, 2007issued as: 7,830,608 on Nov. 9, 2010.

Office Action mailed on Jul. 29, 2008 for U.S. Appl. No. 11/747,172, filed May 10, 2007 published as: US 2007/0268571 A1 on Nov. 22, 2007issued as: 7,830,608 on Nov. 9, 2010.

Office Action mailed on Jul. 8, 2009 for U.S. Appl. No. 11/747,184, filed May 10, 2007 published as: US 2007/0268572 A1 on Nov. 22, 2007.

Office Action mailed on Dec. 10, 2008 for U.S. Appl. No. 11/747,184, filed May 10, 2007 published as: US 2007/0268572 A1 on Nov. 22, 2007.

Office Action mailed on Nov. 3, 2009 for U.S. Appl. No. 11/761,901, filed Jun. 12, 2007 published as: US 2007/0291813 A1 on Nov. 22, 2007 and Issued as: 7,680,170 on Mar. 16, 2010.

Office Action mailed on Aug. 24, 2009 for U.S. Appl. No. 11/761,901, filed Jun. 12, 2007 published as: US 2007/0291813 A1 on Nov. 22, 2007 and Issued as: 7,680,170 on Mar. 16, 2010.

Office Action mailed on Jul. 17, 2012 for U.S. Appl. No. 12/337,275, filed Dec. 17, 2008 published as: US 2009/251697 A1 on Oct. 8, 2009.

Office Action mailed on Dec. 22, 2011 for U.S. Appl. No. 12/337,275, filed Dec. 17, 2008 published as: US 2009/251697 A1 on Oct. 8, 2009.

Office Action mailed on May 11, 2011 for U.S. Appl. No. 12/337,275, filed Dec. 17, 2008 published as: US 2009/251697 A1 on Oct. 8, 2009.

(56) References Cited

OTHER PUBLICATIONS

Office Action mailed on Sep. 23, 2010 for U.S. Appl. No. 11/973,207, filed Oct. 6, 2007 published as: US2008/0131060 A1 on Jun. 5, 2008 and Issued as: 7,866,897 on Jan. 11, 2011.
Office Action mailed on Feb. 18, 2010 for U.S. Appl. No. 11/973,207, filed Oct. 6, 2007 published as: US2008/0131060 A1 on Jun. 5, 2008 and Issued as: 7,866,897 on Jan. 11, 2011.
Office Action mailed on Sep. 2, 2009 for U.S. Appl. No. 11/973,207, filed Oct. 6, 2007 published as: US2008/0131060 A1 on Jun. 5, 2008 and Issued as: 7,866,897 on Jan. 11, 2011.
Office Action mailed on Jan. 26, 2009 for U.S. Appl. No. 11/973,207, filed Oct. 6, 2007 published as: US2008/0131060 A1 on Jun. 5, 2008 and Issued as: 7,866,897 on Jan. 11, 2011.
Office Action mailed on Jun. 14, 2013 for U.S. Appl. No. 12/337,275, filed Dec. 17, 2008 and published as US 2009/0251697 on Oct. 8, 2009.
Supplementary European Search Report completed on Jul. 12, 2013 for EP application No. 09743689.3-1564, and published as EP 2 283 549 on Feb. 16, 2011.
Office Action mailed on May 24, 2013 for U.S. Appl. No. 12/990,215, filed Jan. 12, 2011 and published as US 2011-0103056 on May 5, 2011.
Office Action mailed on May 17, 2013 for U.S. Appl. No. 13/004,679, filed Jan. 11, 2011 and published as US 2012-0177074 on Jul. 12, 2012.
Office Action mailed on Sep. 27, 2013 for U.S. Appl. No. 13/004,679, filed Jan. 11, 2011 and published as US 2012-0177074 on Jul. 12, 2012.
Office Action dated: Mar. 31, 2014 for U.S. Appl. No. 12/990,215 filed Jan. 12, 2011 and published as:2011/0103056 on: May 5, 2011.
Office Action dated: Dec. 24, 2013 for U.S. Appl. No. 12/990,215 filed Jan. 12, 2011 and published as:2011/0103056 on: May 5, 2011.
Supplementary European Search Report dated: Mar. 17, 2014 for European Application No. EP08862579 completed Feb. 19, 2014.
Extended European Search Report dated: May 12, 2015 in European Patent Application No. EP 11735195.7 filed: Jan. 20, 2011.

* cited by examiner

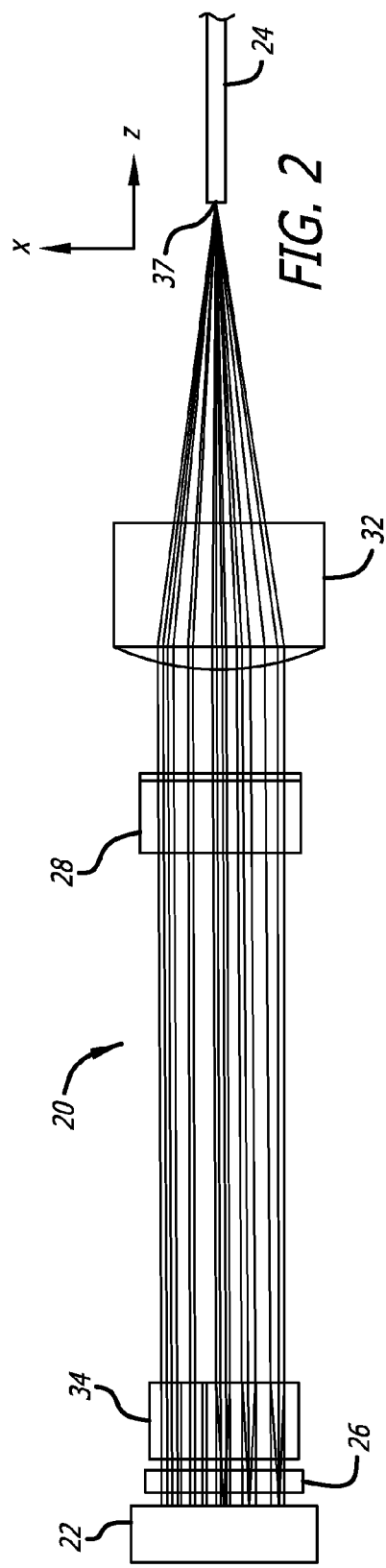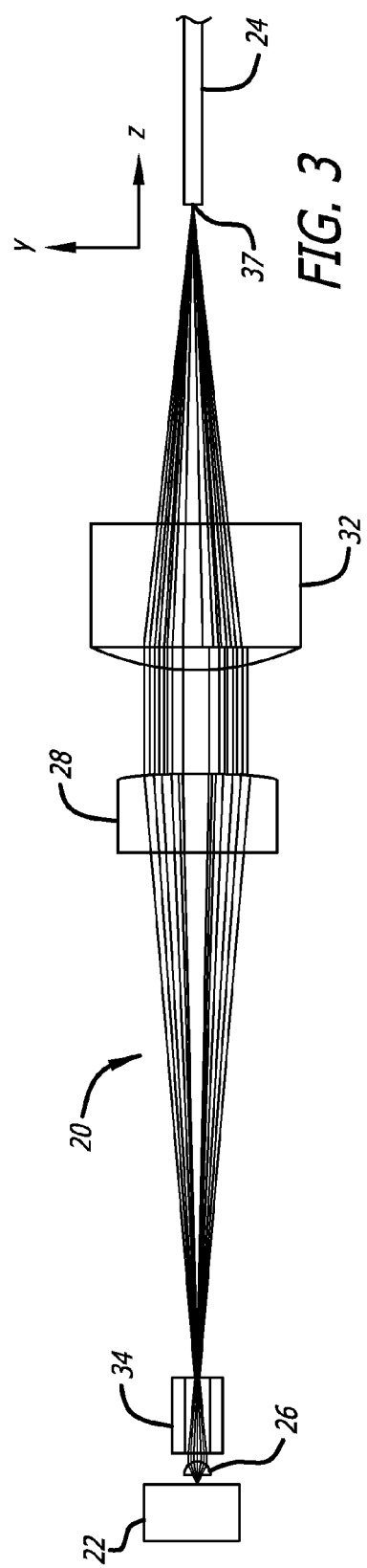

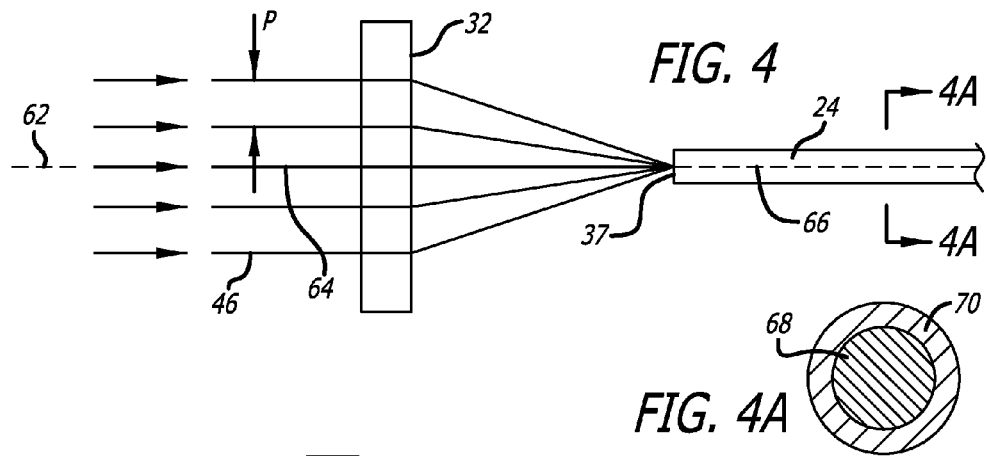
FIG. 4
FIG. 4A
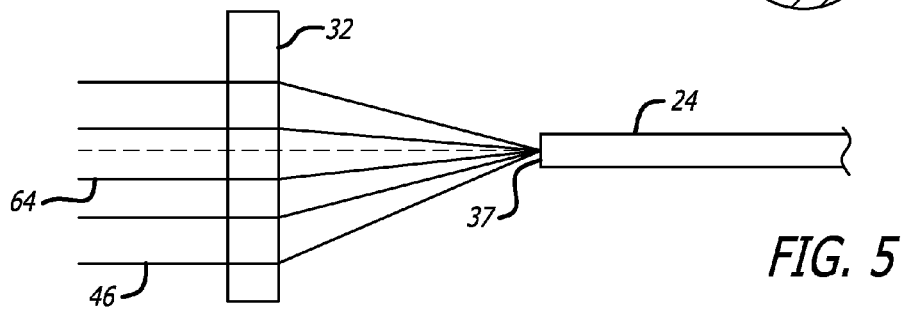
FIG. 5
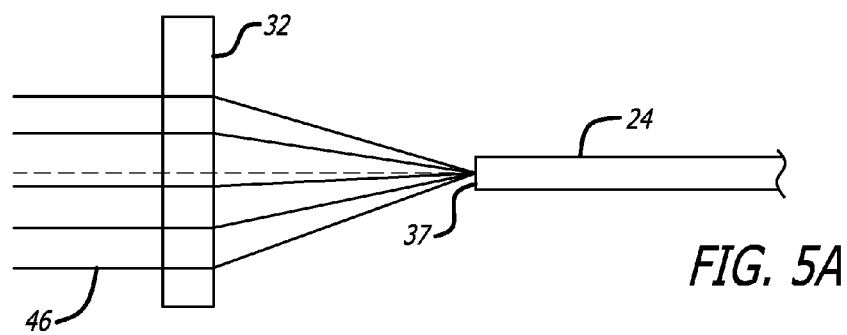
FIG. 5A
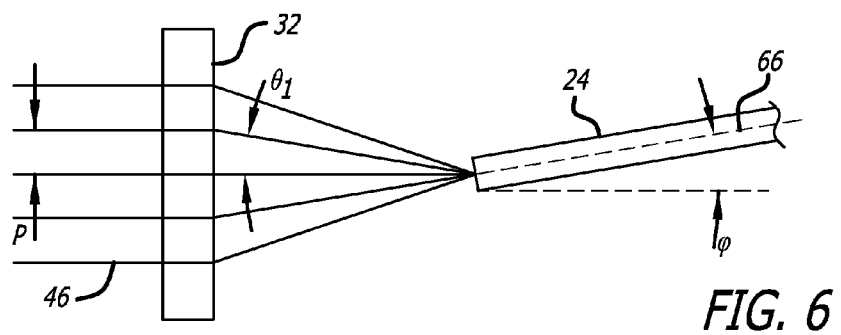
FIG. 6

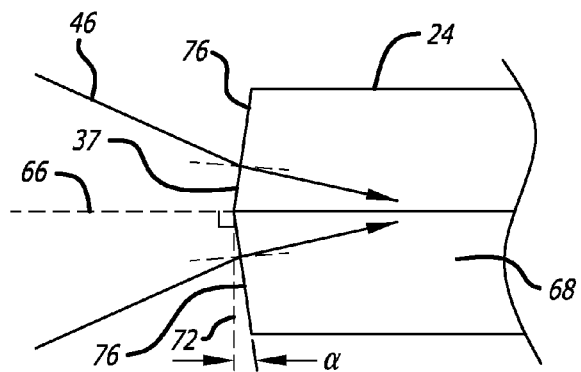
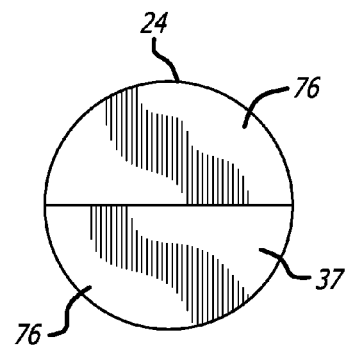
FIG. 10        FIG. 11
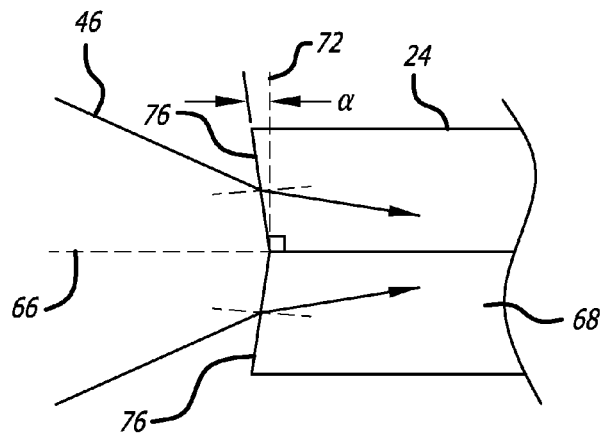
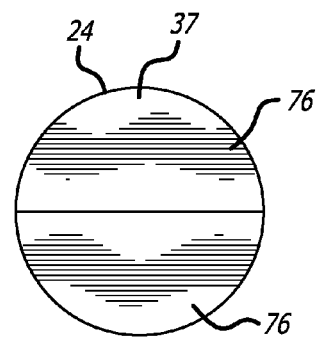
FIG. 12        FIG. 13

HOMOGENIZATION OF FAR FIELD FIBER COUPLED RADIATION

RELATED APPLICATIONS

This application is a national stage application under 35 U.S.C. section 371 of International Patent Application No. PCT/US2011/021931, filed Jan. 20, 2011, entitled "HOMOGENIZATION OF FAR FIELD FIBER COUPLED RADIATION," naming Sang-Ki Park, Edmund L. Wolak, John Kelly Johnson, and Serge Cutillas as inventors, which claims priority under 35 U.S.C. section 119(e) from U.S. Provisional Application No. 61/297,700, filed Jan. 22, 2010, entitled "HOMOGENIZATION OF FAR FIELD FIBER COUPLED RADIATION," naming Sang-Ki Park, Edmund L. Wolak, John Kelly Johnson, and Serge Cutillas as inventors, both of which are incorporated by reference herein in their entirety.

FIELD OF THE INVENTION

Optical systems and components thereof are disclosed which may be used for efficiently coupling laser energy into an optical conduit while maintaining a homogenous far field beam output from the optical conduit. Some embodiments are directed more specifically to far field beam homogenization of optical fiber coupled radiation from a plurality of discrete emitters.

BACKGROUND

Applications requiring light energy and, in some embodiments, laser energy, may benefit from the use of solid state light sources such as laser diodes which are commonly available, reliable to operate and relatively cost effective as a laser energy source. Such devices may include a plurality of laser emitters in a single bar that each emit laser light simultaneously in a substantially parallel orientation. In addition, multiple solid state or laser emitter bars may be disposed in a stacked configuration so as to generate even higher power levels in some instances. Laser diode bars are often used for communication technology devices, medical applications and other applications such as military applications. For some of these applications, as well as others, it may be desirable to couple the output of all the emitters of a single solid state emitter bar or multiple bars in a stacked configuration into a single optical fiber or other optical conduit.

In some circumstances, coupling laser radiation from a linear array of multiple discrete emitters into an optical conduit may result in a non-homogeneous output from the optical conduit in the far field pattern emitted from the optical conduit. Such a non-homogeneous far field pattern may result from the discrete angular distribution of the multiple emitters being coupled into the optical conduit relative to a longitudinal input axis of the optical conduit. This may be particularly true in optical system embodiments which require each beam to be spaced from adjacent beams while propagating through at least some of the optical components of the optical system. For some systems, the separation includes gaps between adjacent beams which may then result in discrete launch angles for each beam or set of beams into the optical conduit. The discrete launch angles into the optical conduit generate a non-homogeneous far field pattern of emission from the optical conduit. This type of far field pattern may include low intensity regions that cause inefficient coupling or transmission of the light in the far field. In addition, this type of far field pattern may include high intensity regions or hot spots that may cause damage to materials with which the far field beam interacts.

What has been needed are methods and devices for generating a homogenous or substantially homogeneous far field beam distribution for the output of an optical conduit. More specifically, what has been needed are methods and devices for generating homogeneous far field beam patterns from an optical conduit from an input source with multiple beams having discrete launch angles.

SUMMARY

Some embodiments of an optical system include a plurality of equally and linearly spaced emitters in a linear array configured to generate a respective plurality of substantially parallel equally spaced output beams. The output beams propagate along output axes of the respective emitters in a symmetrical distribution about a center output beam axis of a center emitter. The system may also include a focusing optic which has an optical axis of symmetry and which is configured to focus or otherwise condense the plurality of substantially parallel output beams from the emitters. The focusing optic may be transversely shifted such that the optical axis of symmetry of the focusing optic is displaced about one eighth the pitch of the plurality of emitters to about three eighths the pitch of the plurality of emitters from the center output axis. The optical system may also include an optical conduit positioned such that an input surface of the optical conduit is operatively coupled to an output axis and focal region of the focusing optic. In some instances, the system may include a beam reformatting optic configured to rotate each beam about its axis about 80 degrees to about 100 degrees, more specifically, about 88 degrees to about 92 degrees. Some system embodiments also include a fast axis collimator, a slow axis collimator or both which may be operatively coupled to the beam axes.

Some embodiments of an optical system include a plurality of equally and linearly spaced emitters in a linear array configured to generate a respective plurality of substantially parallel equally spaced output beams. The output beams may propagate along output axes of the respective emitters in a symmetrical distribution about a center output beam axis of a center emitter. The system may also include a focusing optic which is configured to focus or otherwise condense the plurality of substantially parallel output beams from the emitters. The focusing optic includes an optical axis of symmetry aligned or substantially aligned with the center output axis. The system also has an optical conduit which has a transmitting core. The transmitting core of the optical conduit includes an input surface that is operatively coupled to an output axis and focal region of the focusing optic. The transmitting core further includes a longitudinal axis disposed at a tilt angle with respect to the center beam output axis. The tilt angle may lie substantially in a plane defined by the plurality of beams incident on the optical conduit. The tilt angle may have a magnitude of about one half of the angle formed between adjacent emitter beam axes for beams disposed between the focusing optic and the input of the optical conduit. Some system embodiments also include a beam reformatting optic configured to rotate each beam about a longitudinal axis of the beam by about 80 degrees to about 100 degrees, more specifically, about 88 degrees to about 92 degrees. For some embodiments, the angle formed between adjacent emitter axes between the focusing optic and the input of the optical conduit may be substantially equal to the pitch between adjacent emitters divided by the focal length of the focusing optic. Some system embodiments also include a fast axis collimator, a slow axis collimator or both which may be operatively coupled to the beam axes.

Some embodiments of an optical system include a plurality of equally and linearly spaced emitters in a linear array. The emitters may be configured to generate a respective plurality of substantially parallel equally spaced output beams which propagate along output axes of the respective emitters in a symmetrical distribution about a center output axis of a center emitter. A focusing optic may be operatively coupled to the plurality of emitters and configured to focus the plurality of substantially parallel output beams from the emitters. The system may also include an optical conduit having a transmitting core which includes an input surface that is operatively coupled to an output axis and focal region of the focusing optic. The transmitting core includes a longitudinal axis disposed substantially parallel to the center output axis of the center emitter. The input surface also includes an input angle with respect to a plane that is orthogonal to the longitudinal axis of the transmitting core. The input angle lies substantially in a plane defined by the plurality of beams incident on the optical conduit and may have a magnitude of about $$\theta_1/4(n-1)$$

wherein $\theta_1$ is the angle formed between adjacent emitter beam axes of beams between the focusing optic and the input of the optical conduit and n is the index of refraction of the transmitting core. In some instances, the system also includes a beam reformatting optic configured to rotate each beam about a longitudinal axis of each beam by about 80 degrees to about 100 degrees, more specifically, about 88 degrees to about 92 degrees. For some embodiments, the angle formed between adjacent emitter axes between the focusing optic and the input of the optical conduit is substantially equal to the pitch between adjacent emitters divided by the focal length of the focusing optic. Some system embodiments also include a fast axis collimator, a slow axis collimator or both which may be operatively coupled to the beam axes.

Some embodiments of an optical system include a plurality of equally and linearly spaced emitters configured to generate a respective plurality of substantially parallel equally spaced output beams. The output beams are configured to propagate along output axes of the respective emitters in a symmetrical distribution about a center output axis of a center emitter. A focusing optic may be operatively coupled to the plurality of emitters and configured to focus or otherwise condense the plurality of substantially parallel output beams from the emitters. The system may also include an optical conduit that has a transmitting core. The transmitting core may include an input surface that is operatively coupled to an output axis and focal region of the focusing optic. The transmitting core may also include a longitudinal axis disposed substantially parallel to the center output axis of the center emitter. The input surface includes two facets in a chisel-like configuration forming input angles which are measured between each respective facet surface and a plane that is orthogonal to the longitudinal axis of the transmitting core. The input angles lie substantially in a plane defined by the plurality of beams incident on the optical conduit and may have a magnitude of about $$\theta_1/4(n-1)$$

wherein $\theta_1$ is the angle formed between adjacent emitter beam axes of beams between the focusing optic and the input of the optical conduit and n is the index of refraction of the transmitting core. For some embodiments, the two facets of the input surface have a convex configuration and for other embodiments the two facets of the input surface of the transmitting core have a concave configuration. For some embodiments, the system may also include a beam reformatting optic configured to rotate each beam about a longitudinal axis of each beam by about 80 degrees to about 100 degrees, more specifically, about 88 degrees to about 92 degrees. For some embodiments, the angle formed between adjacent emitter axes between the focusing optic and the input of the optical conduit is substantially equal to the pitch between adjacent emitters divided by the focal length of the focusing optic. Some system embodiments also include a fast axis collimator, a slow axis collimator or both which may be operatively coupled to the beam axes.

Some embodiments of an optical system include a plurality of equally and linearly spaced emitters configured to generate a respective plurality of substantially parallel equally spaced output beams. The output beams are configured to propagate along output axes of the respective emitters in a symmetrical distribution about a center output axis of a center emitter. A focusing optic may be operatively coupled to the plurality of emitters and configured to focus or otherwise condense the plurality of substantially parallel output beams from the emitters. The system may also include an optical conduit having a transmitting core with an input surface that is operatively coupled to an output axis and focal region of the focusing optic. The transmitting core of the optical conduit has a longitudinal axis which may be disposed substantially parallel to the center output axis of the center emitter. The input surface includes four facets in a convex trocar-like configuration forming input angles which are measured between each respective facet surface and a plane that is orthogonal to the longitudinal axis of the transmitting core. The input angles may have a magnitude of about $$\theta_1/4(n-1)$$

wherein $\theta_1$ is the angle formed between adjacent emitter beam axes of beams between the focusing optic and the input of the optical conduit and n is the index of refraction of the transmitting core. For some embodiments, the system may include a beam reformatting optic configured to rotate each beam about a longitudinal axis of each beam by about 80 degrees to about 100 degrees, more specifically, about 88 degrees to about 92 degrees. For some embodiments, the angle formed between adjacent emitter axes between the focusing optic and the input of the optical conduit is substantially equal to the pitch between adjacent emitters divided by the focal length of the focusing optic. Some system embodiments also include a fast axis collimator, a slow axis collimator or both which may be operatively coupled to the beam axes.

Some embodiments of an optical system include a plurality of equally and linearly spaced emitters configured to generate a respective plurality of substantially parallel equally spaced output beams. The output beams are configured to propagate along output axes of the respective emitters in a symmetrical distribution about a center output axis of a center emitter. A focusing optic may be operatively coupled to the plurality of emitters and configured to focus or otherwise condense a plurality of substantially parallel output beams from the emitters. The system also includes an optical conduit with a transmitting core. The transmitting core has an input surface which is operatively coupled to an output axis and focal region of the focusing optic. The input surface includes a rounded configuration having an apex substantially centered on the input surface. For some embodiments, the system may include a beam reformatting optic configured to rotate each beam about a longitudinal axis of each beam by about 80 degrees to about 100 degrees, more specifically, about 88 degrees to about 92 degrees. Some system embodiments also include a fast axis collimator, a slow axis collimator or both which may be operatively coupled to the beam axes. In some instances, the rounded configuration of the input surface of the transmitting core may be substantially spherical and may have a radius of curvature of about 0.4 mm to about 1.2 mm.

Some embodiments of an optical system including a plurality of linearly spaced emitters configured to generate a respective plurality of substantially parallel equally spaced output beams along output axes of the respective emitters in a symmetrical distribution about a center output axis of a center emitter. A focusing optic may be operatively coupled to the plurality of emitters and configured to focus a plurality of substantially parallel output beams from the emitters. The system may also include an optical conduit having a transmitting core that includes an input surface which is operatively coupled to an output axis and focal region of the focusing optic. The input surface of the optical conduit includes a cylindrical lens element substantially centered on the input surface. The input surface also has a radius of curvature lying substantially in a plane defined by the beams incident on the optical conduit. For some embodiments the cylindrical lens element has a convex configuration and for some embodiments the cylindrical lens element has a concave configuration. The radius of curvature of the cylindrical lens element may be about 0.2 mm to about 1.5 mm in some instances. For some embodiments, the system may also include a beam reformatting optic configured to rotate each beam about a longitudinal axis of each beam by about 80 degrees to about 100 degrees, more specifically, about 88 degrees to about 92 degrees. Some system embodiments also include a fast axis collimator, a slow axis collimator or both which may be operatively coupled to the beam axes.

Some embodiments of an optical system include a plurality of equally and linearly spaced emitters configured to generate a respective plurality of substantially parallel equally spaced output beams. The output beams may be configured to propagate along output axes of the respective emitters in a symmetrical distribution about a center output axis of a center emitter. A focusing optic may be operatively coupled to the plurality of emitters and configured to focus or otherwise condense the plurality of substantially parallel output beams from the emitters. The system may also include an optical conduit having a transmitting core that includes an input surface which is operatively coupled to an output axis and focal region of the focusing optic. An optical shift element may be disposed generally between the plurality of emitters and focusing optic. The optical shift element may be configured to refract and shift the optical axes of the output beams which are on one side of the center output beam axis. Some embodiments of the system may also include a beam reformatting optic configured to rotate each beam about a longitudinal axis of the beam by about 80 degrees to about 100 degrees, more specifically, about 88 degrees to about 92 degrees. Some embodiments of the optical shift element include a block of transmissive material having an input surface which is parallel to an output surface. The optical shift element may also include a wedge of transmissive material. Some system embodiments also include a fast axis collimator, a slow axis collimator or both which may be operatively coupled to the beam axes.

Some embodiments of an optical system include a plurality of equally and linearly spaced emitters configured to generate a respective plurality of substantially parallel equally spaced output beams. The beams may be configured to propagate along output axes of the respective emitters in a symmetrical distribution about a center output axis of a center emitter. A focusing optic may be operatively coupled to the plurality of emitters and configured to focus or otherwise condense the plurality of substantially parallel output beams from the emitters. The system may also include an optical conduit having a transmitting core that has an input surface which is operatively coupled to an output axis and focal region of the focusing optic. The optical system may also include a telescope array which is disposed in operative arrangement within an optical train of the optical system between the plurality of linearly spaced emitters and the focusing optic. Some system embodiments also include a fast axis collimator, a slow axis collimator or both which may be operatively coupled to the beam axes. For such embodiments, the telescope array may be disposed between the fast axis collimator and focusing optic. In some instances, the telescope array may be disposed between an optional beam reformatting optic and a slow axis collimator of the optical system. In some embodiments, the telescope array may be so disposed immediately adjacent the optional beam reformatting element or optic. The telescope array may be configured to expand each beam from the laser emitter bar to contact or overlap adjacent beams prior to focusing of the beams into the optical conduit. The expansion of each beam may be achieved by the telescope elements without adding substantial or significant divergence or convergence of the individual beams. For some embodiments, the system may include a beam reformatting optic which may be configured to rotate each beam about its axis about 80 degrees to about 100 degrees, more specifically, about 88 degrees to about 92 degrees. For some embodiments, the telescope array may include an array of Keplerian telescopes having a pitch substantially the same as the plurality of linearly spaced emitters. For some embodiments, the telescope array may include an array of Galilean telescopes having a pitch substantially the same as the plurality of linearly spaced emitters.

These features of embodiments will become more apparent from the following detailed description when taken in conjunction with the accompanying exemplary drawings.

BRIEF DESCRIPTION OF THE DRAWINGS

FIG. 2 is a top view of an optical system for coupling multiple emitters to an optical conduit.

FIG. 3 is an elevation view of the optical system of FIG. 2.

FIG. 4 is a schematic view of an optical system with multiple parallel beams with a focusing lens disposed in a centered symmetrical configuration with respect to the center beam.

FIG. 4A is a transverse cross section of the optical fiber of FIG. 4 taken along lines 4A-4A of FIG. 4.

FIG. 5 is a schematic view of the optical system of FIG. 4 with multiple parallel beams with the focusing lens transversely shifted by about one half the transverse pitch of the multiple parallel beams.

FIG. 5A is a schematic view of the optical system of FIG. 4 with multiple parallel beams with the focusing lens transversely shifted by about one quarter the transverse pitch of the multiple parallel beams.

FIG. 6 is a schematic view of an optical system with multiple parallel beams focused into an optical fiber having a longitudinal axis which is tilted relative to an optical axis of the multiple parallel beams.

FIG. 10 is an elevation cut away view of an input section of an optical fiber having a convex chisel-shape input surface.

FIG. 11 is an end view of the input surface of the optical fiber of FIG. 10.

FIG. 12 is an elevation cut away view of an input section of an optical fiber having a concave chisel-shape input surface.

FIG. 13 is an end view of the input surface of the optical fiber of FIG. 12.

DETAILED DESCRIPTION

Embodiments discussed herein are directed to methods and devices for manipulating an output of multiple emitters such as laser emitter bars or chips having one or more emitters disposed therein. Embodiments discussed herein are also directed to methods and devices for coupling an output of laser emitter bars to an optical conduit, such as an optical fiber. Some optical system embodiments which are useful for coupling the output beams of multiple emitters to an optical conduit may include a beam reformatting optic. Some embodiments of such optical systems may include a beam reformatting optic that rotates each beam from each emitter individually or performs some other reformatting function. For such embodiment, it may be desirable to maintain spatial separation between each beam as they propagate through at least a portion of the optical train of the optical system. If the beams of the optical system are separated from adjacent beams upon launch into an optical conduit, the discrete launch angles of each beam or set of beams may result in a non-homogeneous output distribution in the far field pattern of the output of the optical conduit.

Figure 1:
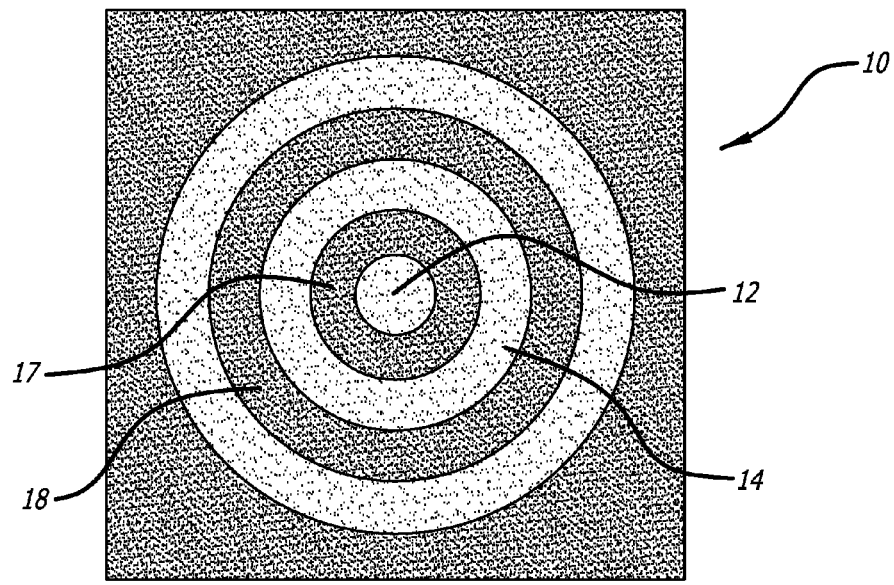
FIG. 1 is a schematic representation of a far field beam output pattern from an optical fiber.

FIG. 1 illustrates an embodiment of a far field pattern 10 from an output of an optical conduit in the form of a multi-mode optical fiber. The far field pattern 10 shown is the result of coupling the output beams of five emitters of a laser emitter bar having five respective emitters. The center region 12 of high intensity of the far field pattern 10 may correspond to an output beam of the center emitter of the laser emitter bar. The center emitter of the laser emitter bar may be aligned with an optical axis of the optical system that couples the beams to the optical conduit. The first ring 14 of high intensity disposed about the center region 12 is generated from the two beams adjacent the center beam, or center +1 and center −1 beams. For an optical system having a symmetrical optical axis with respect to the center emitter, each beam adjacent the center beam may have a similar launch angle into the optical fiber and contributes to the first high intensity ring 14. Similarly, the second ring 16 of high intensity light disposed about but separated from the first ring 14 of high intensity, may be generated from the outside beam pair from a laser emitter bar. The beam pair has a launch angle with the greatest magnitude of the five beams of such a system. Once again, each outermost beam, center +2 and center −2, has a similar launch angle into the optical fiber and contributes to the second high intensity ring 16. The pattern 10 also includes a first low intensity ring 17 and a second low intensity ring 18.

FIGS. 2 and 3 illustrate an optical system embodiment 20 for coupling an output of a laser emitter bar 22 having five emitters to an optical conduit in the form of an optical fiber 24. The optical system 20 shown includes a laser emitter bar 22, such as the laser emitter bar illustrated in FIG. 1A, a fast axis collimator 26, a slow axis collimator 28, a focusing optic 32 and an optical conduit in the form of the optical fiber 24. The system 20 also includes a beam reformatting optic 34. In general, light is generated by each of the five emitters of the laser emitter bar 22 and propagates into the fast axis collimator 26 which collimates each beam along the fast axis 36, shown in FIG. 1A. Each beam then passes through the beam reformatting optic 34 which rotates each beam individually about a longitudinal axis of each respective beam. For some embodiments, each beam is rotated about 90 degrees. Each beam then passes through a slow axis collimator 28 which substantially collimates each beam along the slow axis thereof. Finally, each beam and the beam pattern or array of all five beams together is focused or otherwise condensed by the focusing optic 32 into an input surface 37 of the optical fiber 24. It should be noted that the fast axis collimator 26 and slow axis collimator 28 may be configured to exert their optical power in the same plane in systems which include a beam reformatting optic that rotates each beam, as is shown in the system of FIGS. 2 and 3. In addition, the fast axis collimator 26 may include a single optical element or multiple optical elements depending on the configuration of the output beams incident upon the fast axis collimator. The same holds true for the slow axis collimator 28. For the system embodiment 20 shown in FIGS. 2 and 3, both the fast axis collimator 26 and slow axis collimator 28 are single lens units that extend and are effective across the output beam array.

Figure 1A:
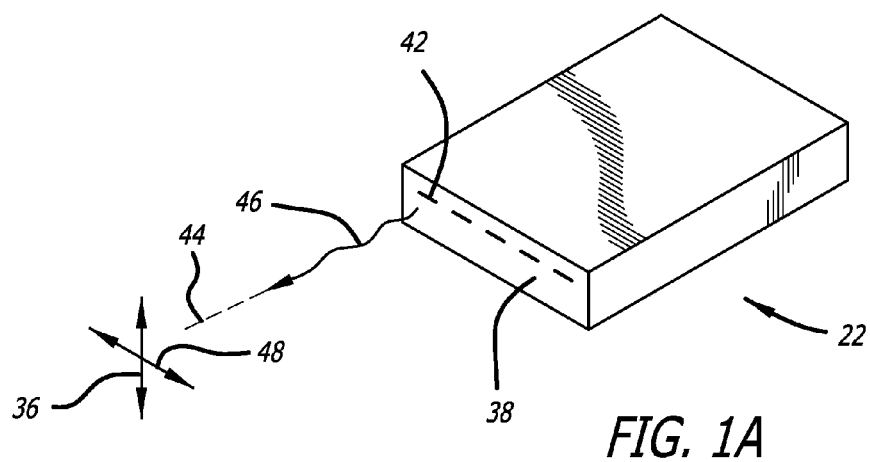
FIG. 1A is a perspective view of an embodiment of a laser emitter bar.

Regarding the laser emitter bar 22, FIG. 1A illustrates the laser emitter bar 22 having an output surface 38 that includes a total of 5 emitters 42 which have optical axes 44 that are substantially parallel to each other beam 46. Although optical system embodiments discussed herein are generally directed to use with single emitter bars, a stacked array of 2, 3, 4, 5 or more laser emitter bars 22 may be used with some embodiments. The emitters 42 of the laser emitter bar 22 are disposed in a substantially linear row along a slow axis direction of the emitters, as indicated by arrow 48 in FIG. 1A. A fast axis direction of the emitters is perpendicular to the slow axis direction and is indicated by arrow 36 in FIG. 1A. The emitters are positioned or otherwise configured so as to emit light energy in output beams 46 that propagate along an emission or beam axis 44 which may be perpendicular to both the slow axis direction 48 and fast axis direction 36. It should be noted that the fast axis direction indicated by arrow 36 and slow axis direction indicated by arrow 48 shown in FIG. 1A are applicable to beams immediately adjacent the laser emitter bar 22. For system embodiments that include beam reformatting optics, such as those that rotate the beams, the orientation of either or both of these axes may change depending on the location within the optical system.

Laser emitter bar embodiments 22 may have any suitable number of emitters, such as about 1 emitter to about 100 emitters, more specifically, about 3 emitters to about 12 emitters. For some embodiments, each laser emitter bar 22 having about 5 emitters 16 may have an output power of about 5 Watts (W) to about 90 W, more specifically, about 15 W to about 70 W, and even more specifically, about 20 W to about 30 W. Emitters 42 may include laser diodes such as edge emitting laser diodes, vertical cavity surface emitting lasers (VCSELs) and the like. Materials for the emitters 42 of the laser emitter bar 22 may include semiconductor materials such as GaAs, InP or any other suitable laser gain medium.

Generally, the emitting aperture of a laser diode embodiment of an emitter embodiment 42 may be rectangular in shape with the long dimension of the emitter having a size of typically tens or hundreds of microns, while the short dimension is typically one to several microns in size. Radiation emerging from an emitter 42 diverges with the divergence angle being greater along the short emitter direction. Divergence angles are lower in the direction of the long emitter direction. Some embodiments of the emitters 42 may have a physical width of about 30 microns to about 300 microns, more specifically, about 50 microns to about 200 microns, and the emitters may have a height of about 1 micron to about 3 microns. Some emitter embodiments 42 may have a cavity length of about 0.5 mm to about 10 mm, more specifically, about 1 mm to about 7 mm, and even more specifically, about 3 mm to about 6 mm. Such emitter embodiments 42 may have a divergence of light energy output of about 2 degrees to about 14 degrees, more specifically, about 4 degrees to about 12 degrees, in the slow axis direction and a divergence of light energy output of about 30 degrees to about 75 degrees in the fast axis direction.

Some embodiments of the laser emitter bars 22 may have emitters 42 that emit light energy having a wavelength of about 700 nm to about 1500 nm, more specifically, about 800 nm to about 1000 nm. Emitters 42 may emit light having a centroid or peak wavelength of about 300 nm to about 2000 nm, more specifically, of about 600 nm to about 1000 nm, including wavelengths across the near infrared spectrum. Some particular embodiments of useful emitters 42 may emit light at a peak wavelength of about 350 nm to about 550 nm, 600 nm to about 1350 nm or about 1450 nm to about 2000 nm. Such laser diode bars 22 may be operated in either a pulsed mode or continuous wave mode. Frequently, the output spectral band of individual emitters 42 which are not wavelength controlled (for example wavelength controlled by providing wavelength-dependent feedback from a volume index grating or the like) may be about 0.5 nm to about 2.0 nm or more. Due to the variation in peak emission wavelength in addition to the spectral band for each individual emitter 42, the overall bandwidth of the laser emitter bar may be about 2 nm to about 5 nm, for some embodiments.

Figure 3A:
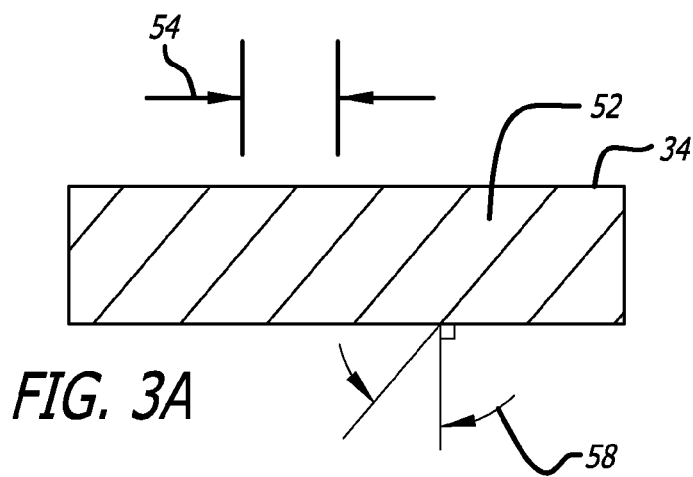
FIG. 3A is an elevation view of an embodiment of a beam reformatting optic.
Figure 3B:
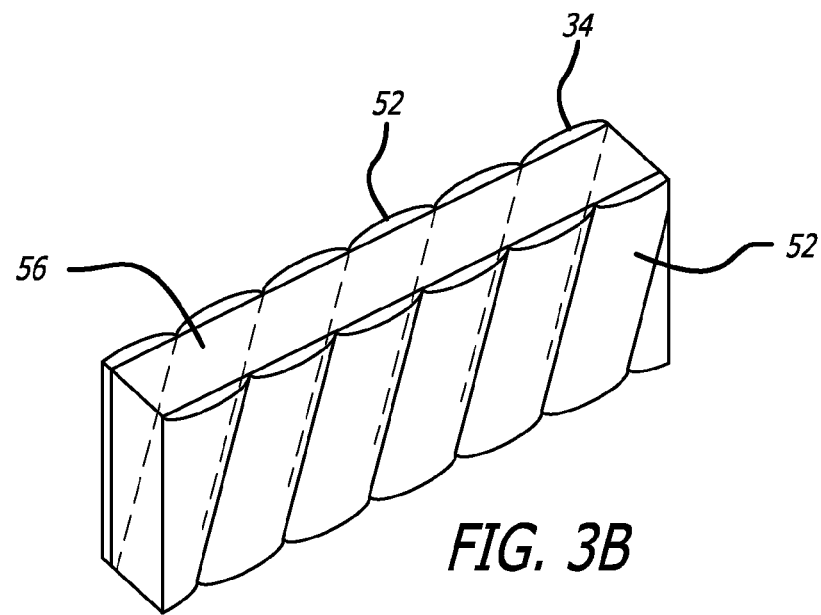
FIG. 3B is a perspective view of the beam reformatting optic of FIG. 3A.

Regarding the beam reformatting optic 34, FIG. 3A illustrates an embodiment of such an optic in the form of a refractive offset cylindrical lens array 34. The lens array 34 is included in the optical system 20 of FIGS. 2 and 3 and is configured for 90 degree rotation of each discrete beam 46 from each emitter 42 of the laser emitter bar 22. FIG. 3B is a perspective view of the refractive offset cylindrical lens array 34. The optic 34 includes an array of opposed pairs of diagonally oriented cylindrical lenses 52. Each opposed pair of lenses 52 of the beam reformatting optic 34 may have a lateral separation or pitch 54 that is substantially the same as the lateral separation or pitch of the individual emitters 42 of the laser emitter bar 22 of the system 20. The refractive beam reformatting optic may be made from any suitable optical material such as glass, quartz, silica or the like. A transmissive block 56 disposed between each opposed pair of lenses 52 may be sized such that any opposing symmetrical pair of cylindrical lens elements 52 focus at the same point or line within the body of the transmissive block 56. Such a configuration may be adjusted such that it will rotate an incident output beam 46 about the longitudinal axis 44 of the beam 46 by approximately 90 degrees such that the fast axis and slow axis of the output beam 46 may be reversed. The rotation of the individual output beams 46 may be useful to achieve a symmetrical beam product and beam profile between the fast axis and slow axis and may facilitate subsequent focusing or concentration of the output beams 46 while maintaining brightness. The slant or angular orientation of the cylindrical lens elements 52 of the beam reformatting optic 34 may be set to an angle of about 40 degrees to about 50 degrees, as indicated by arrows 58 in FIG. 3A.

As discussed above, each emitter 42 of the laser emitter bar 22 emits a discrete beam 46 that is substantially collimated along the fast axis by the fast axis collimator. Each beam then passes through a respective lens pair of the beam reformatting optic 34 for rotation about an optical axis of each beam of about 80 degrees to about 100 degrees, more specifically, about 88 degrees to about 92 degrees. Once the output beams 46 have passed through the beam reformatting optic 34, they pass through the slow axis collimator 28. Because the fast and slow axes of the output beams 46 have been reversed by the beam reformatting optic 34, the slow axis collimator 28 disposed after the beam reformatting optic 34 may be a singlet cylindrical lens. The slow axis collimator 28 substantially collimates each individual beam 46 along the slow axis direction. After transmission through the slow axis collimator 28, each substantially collimated beam 46 propagates to the focusing optic 32.

The focusing optic 32 may include a single lens or multiple optics that is configured to focus or otherwise condense the substantially collimated beams 46 to a region or focal point which may then be directed into the input surface 37 of the optical conduit or optical fiber 24. The optical conduit shown includes the optical fiber 24 which may be a multimode optical fiber having an amorphous core material and an amorphous cladding material having an index of refraction less than an index of refraction of the core material. Although a solid material multimode optical fiber embodiment 24 is shown, any other suitable optical conduit may be used. In particular, the optical conduit may include single mode optical fibers, hollow waveguides, crystalline optical fibers, polymer optical fibers or the like. Because the beam reformatting optic 34 operates on each beam discretely without overlap or contact between beams 46, each beam incident on the focusing optic 32 may still be discrete without contact or overlap. As such, each beam 46 or symmetrical pair of opposed beams will be focused by the focusing optic 32 and launch into the input surface 37 of the optical fiber 24 at a discrete angle. This arrangement may then produce a beam intensity distribution in the far field emission pattern 10 from an output surface (not shown) of the optical fiber 24 as indicated by the pattern 10 of FIG. 1. This is particularly true for the embodiment shown wherein the optical axis 44 of the center beam is substantially aligned with an optical axis of the focusing lens 32.

The non-homogeneous far field pattern 10 of FIG. 1 may be undesirable for a variety of reasons depending on how the high intensity output of the optical fiber 24 will be used. As discussed above, this type of far field pattern 10 includes low intensity regions 17 and 18 that may cause inefficient coupling or transmission of the light in the far field. In addition, this type of far field pattern 10 includes high intensity regions 14 and 16 or hot spots that may cause damage to materials with which the far field beam interacts. Therefore, for some applications, it may be desirable to either blur the discreteness of the far field pattern shown in FIG. 1. It may also be desirable to shift high intensity portions of the output pattern into low intensity regions of the output pattern or vice versa, in order to substantially homogenize the far field pattern 10.

FIGS. 4-5A illustrate an embodiment of a focusing lens 32 and optical fiber 24 that may be used in the optical system 20 of FIGS. 2 and 3 in order to substantially homogenize the far field pattern 10 emitted from the optical fiber 24. FIG. 4 illustrates a typical embodiment of five discrete beams 46 having a pitch P directed onto a focusing optic 32. For the embodiment of FIG. 4, the optical axis 62 of the center beam 64 is substantially aligned with an optical axis 66 of a core 68 of the optical fiber 24. The optical fiber may also include a cladding 70, which may be a step index cladding as shown in FIG. 4A. Such an arrangement, similar to that shown in FIGS. 2 and 3, may produce the non-homogenous far field pattern 10 shown in FIG. 1. FIG. 5 illustrates a different arrangement whereby the optical axis of the beams 46 have been laterally shifted with respect to the optical axis of the focusing lens 32 and optical fiber 24 by about one half the pitch P of the individual beams 46. The lateral shifting of the optical axis of the focusing lens 32 with respect to the optical axis 62 of the center beam 64 of the output of the laser emitter bar 22 may be used to blur the far field pattern 10 of the optical fiber 24. FIG. 5A illustrates another embodiment of this approach. FIG. 5A includes a focusing optic 32 and optical conduit 24 that may be incorporated into the optical system 20 shown in FIGS. 2 and 3.

Such an optical system 20 may include a plurality of linearly spaced emitters 42 configured to generate a respective plurality of substantially parallel equally spaced output beams 46 along output axes 44 of the emitters 42 in a symmetrical distribution about a center output axis of a center emitter. The focusing optic 32 includes an optical axis of symmetry, which is configured to focus the plurality of substantially parallel output beams 46 from the emitters 42. The optical conduit 24 is positioned such that an input surface 37 of the optical conduit 24 is operatively coupled to an output axis and focal region of the focusing optic 32. The focusing optic 32 is also transversely shifted such that the optical axis of symmetry of the focusing optic is displaced about one eighth the pitch of the plurality of emitters 42 to about three eighths the pitch of the plurality of emitters 42 from the center output axis of the center beam. For some embodiments, the focusing optic 32 is transversely shifted about one quarter the pitch P of the plurality of emitters 42 from the center output axis. Some system embodiments also include a fast axis collimator 26, a slow axis collimator 28 or both which may be operatively coupled to the beam axes 44. The fast axis collimator 26 may be configured to substantially collimate the output of each emitter 42 in a fast axis direction and the slow axis collimator 28 may be configured to substantially collimate the output of each emitter 42 in a slow axis direction. It should be noted that the fast axis collimator 26 and slow axis collimator 28 may be configured to exert their optical power in the same plane in systems which include a beam reformatting optic 34 that rotates each beam 46, as is shown in the system of FIGS. 2 and 3.

FIG. 6 illustrates another approach for homogenizing the far field pattern of the optical conduit 24. FIG. 6 illustrates a focusing optic 32 and optical fiber 24 that may be incorporated into the optical system 20 of FIGS. 2 and 3. The optical system 20 may include a plurality of linearly spaced emitters 42 configured to generate a respective plurality of substantially parallel equally spaced output beams 46 along output axes 44 of the emitters 42 in a symmetrical distribution about a center output axis of a center emitter. The focusing optic 32 is configured to focus the plurality of substantially parallel output beams 46 from the emitters 42. The focusing optic 32 also includes an optical axis of symmetry aligned with the center output axis of the center beam. An optical conduit in the form of multimode optical fiber 24 includes a transmitting core which includes an input that is operatively coupled to an output axis and focal region of the focusing optic 32. The optical conduit 24 also includes a longitudinal axis 66 disposed at a tilt angle $\phi$ with respect to the center output axis 62 of the center beam. The tilt angle $\phi$ lies substantially in a plane defined by the beams 46 incident on the focusing optic 32 and optical conduit 24. For some embodiments, the tilt angle $\phi$ of the optical conduit 24 may have a magnitude of about one half of the angle $\theta_1$ formed between adjacent emitter axes between the focusing optic and the input of the optical conduit. For some embodiments, the angle $\theta_1$ formed between adjacent emitter axes 44 between the focusing optic 32 and the input 37 of the optical conduit 24 may be substantially equal to the pitch P between adjacent emitters 42 divided by the focal length of the focusing optic 32.

In some instances, system embodiments 20 may also include a fast axis collimator 26, a slow axis collimator 28 or both which may be operatively coupled to the beam axes 44. The fast axis collimator 26 may be configured to substantially collimate the output of each emitter 42 in a fast axis direction and the slow axis collimator 28 may be configured to substantially collimate the output of each emitter 42 in a slow axis direction.

Figure 7:
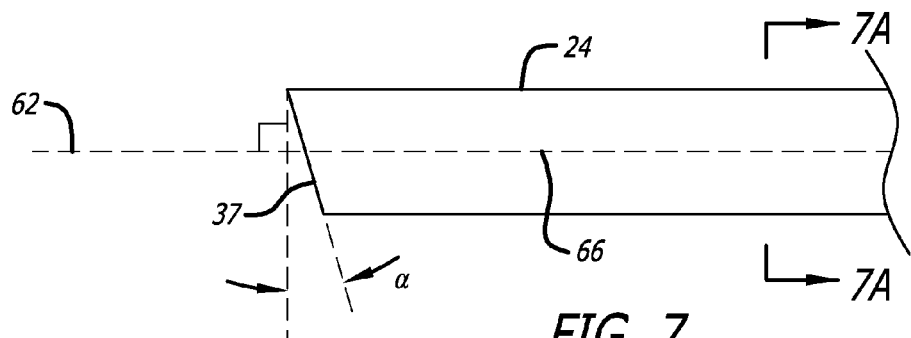
FIG. 7 is an elevation view of an optical fiber having an angled input surface which is non-orthogonal relative to a longitudinal axis of the optical fiber.
Figure 8:
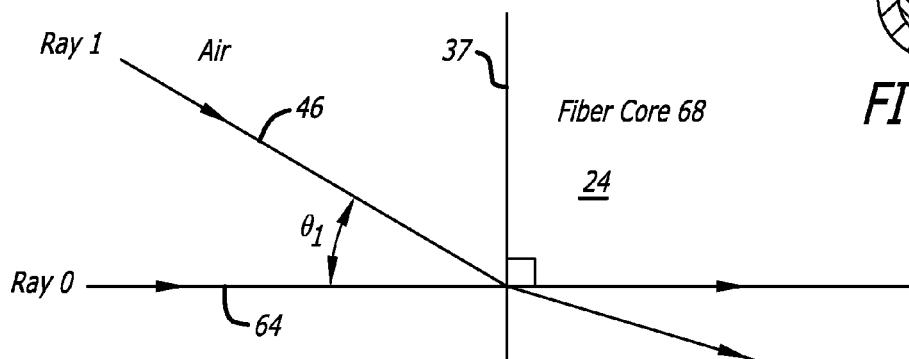
FIG. 8 depicts a ray trace of the refraction of a beam propagating through air and incident on an optical fiber input surface which is orthogonal to a longitudinal axis of the optical fiber.
Figure 9:
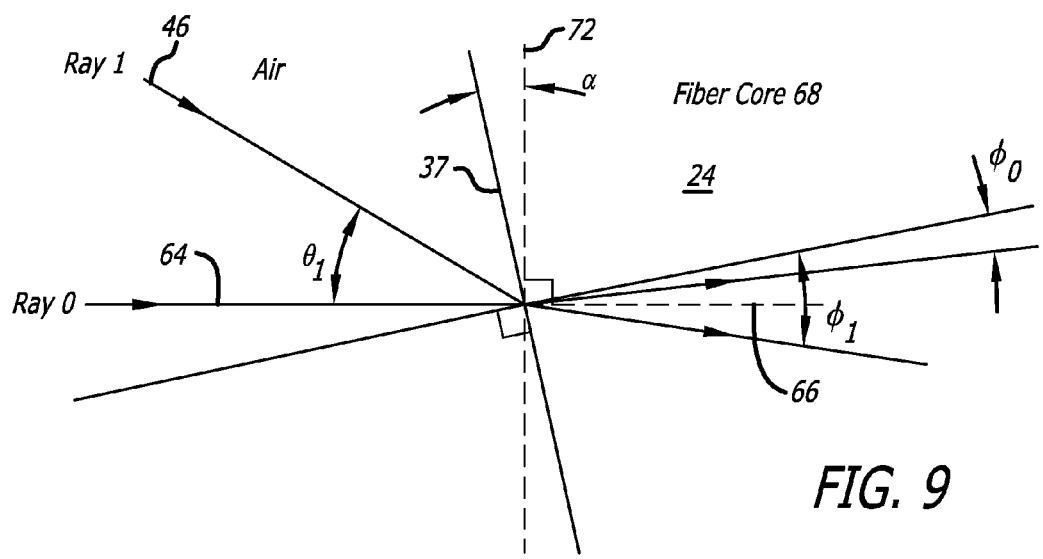
FIG. 9 depicts a ray trace of refraction of a beam propagating through air and incident on an optical fiber input surface which forms an angle α with respect a plane which is orthogonal to a longitudinal axis of the optical fiber.

FIGS. 7-9 illustrate another embodiment of a means for homogenizing a far field pattern 10 of an optical conduit 24 coupled to discrete emitter beams 46. FIGS. 7-9 illustrate an optical conduit embodiment 24 that may be incorporated into the optical system 20 of FIGS. 2 and 3. The optical system 20 may include a plurality of linearly spaced emitters 42 configured to generate a respective plurality of substantially parallel equally spaced output beams 46. The output beams 46 may propagate along output axes 44 of the respective emitters 42 in a symmetrical distribution about a center output axis of a center emitter. A focusing optic 32 may be operatively coupled to the plurality of emitters 42 and configured to focus a plurality of substantially parallel output beams 46 from the emitters 42. The optical conduit 24 may include a transmitting core 68 which includes an input surface 37 that is operatively coupled to an output axis and focal region of the focusing optic 32. The optical conduit may also include a cladding 70 for solid optical fiber embodiments of the optical conduit 24. The optical conduit 24 may also include a longitudinal axis 66 disposed substantially parallel to the center output axis 62 of the center emitter. The input surface 37 may further include an input angle $\alpha$ with respect to a plane that is orthogonal to the longitudinal axis 66 of the core of the optical conduit 24. For such an embodiment, homogenization of the far field pattern 10 may require a proper rotational orientation of the optical fiber 24 about a longitudinal axis 66 of the optical fiber 24. In particular, the input angle $\alpha$ may lie substantially in a plane defined by the beams 46 incident on the optical conduit 24 and focusing optic 32. The input angle $\alpha$ may have a magnitude of about $\theta_1/4(n-1)$ wherein $\theta_1$ is the angle formed between adjacent emitter beam axes 44 of beams 46 between the focusing optic 32 and the input 37 of the optical conduit 24 and n is the index of refraction of the transmitting core of the optical fiber 24.

For some embodiments, the angle $\theta_1$ formed between adjacent emitter axes 44 between the focusing optic 32 and the input 37 of the optical conduit 24 may be substantially equal to the pitch P between adjacent emitters divided by the focal length of the focusing optic 32. For some embodiments, the input angle $\alpha$ may be from about 1 degree to about 3 degrees. Some system embodiments 20 also include a fast axis collimator 26, a slow axis collimator 28 or both which may be operatively coupled to the beam axes 44. The fast axis collimator 26 may be configured to substantially collimate the output of each emitter 42 in a fast axis direction and the slow axis collimator 28 may be configured to substantially collimate the output of each emitter 42 in a slow axis direction.

FIG. 8 illustrates a schematic representation of two rays or beams 46 refracting at an interface between the input surface of an optical fiber and the air surrounding the input surface. For the representation of FIG. 8, the fiber input surface 37 has no input angle $\alpha$. As such, the center beam 64 of a beam array (Ray 0) being focused by a focusing optic 32 onto the fiber input surface 37 is substantially perpendicular to the input surface 37 both before and after refraction. A beam that is adjacent the center beam 64, indicated also as Ray 0, or center +1 beam, represented by Ray 1, forms an angle of incidence $\theta_1$ with the input surface 37 of the optical fiber. In general, $\theta_1$ may be equal to the pitch P of the beams or emitters before the focusing optic 32 divided by the focal length of the focusing optic 32 as discussed above. For the embodiment shown in FIG. 8, the angle separation $\theta_1$ between Ray 0 and Ray 1 may create a non-homogeneous far field pattern 10 as shown in FIG. 1 and discussed above.

FIG. 9 is a schematic representation of two rays refracting at an interface between an input surface 37 of an optical fiber 24 and the air surrounding the input surface. For the embodiment shown in FIG. 9, the input surface 37 of the optical fiber 24 is angled at an angle $\alpha$ between the input surface 37 of the optical fiber 24 and a plane 72 perpendicular to a longitudinal axis 66 of optical fiber core 68. For the particular configuration of input angle, index of refraction of the material of the core of the optical fiber, and incidence angles of Ray 0 and Ray 1, illustrated in FIG. 9, Ray 0 and Ray 1 are symmetric with the longitudinal axis 66 of the optical fiber 24 after refraction.

For Ray 0 and Ray 1, the following equations are given by Snell's law:

$\sin \alpha = n \sin \phi_0$ (1)

$\sin(\theta_1 + \alpha) = n \sin \phi_1$ (2)

Where n is the index of refraction of the optical fiber core 68 and the air disposed about the input surface 37 of the optical fiber core 68 has an index of refraction of 1.

These equations (1) and (2) may be approximated as:

$\alpha = n\phi_0$ (3)

$\theta_1 + \alpha = n\phi_1$ (4)

For the circumstance described above where Ray 0 and Ray 1 are symmetric with the longitudinal axis 66 of the optical fiber 24, a center portion 12 of the far field output pattern 10 of the optical fiber 24 would be dark or of low intensity. To achieve this configuration, $\alpha - \phi_0 = \phi_1 - \alpha$ (5)

Combining equations (3)-(5) gives $\alpha = \theta_1/2(n-1)$ (6)

To fill the center portion 12 of the far field pattern 10, the input angle should be about one half the angle $\alpha$ given in equation (6). Therefore, an embodiment of a desired input angle $\alpha'$ for the core of the optical fiber that may be configured to substantially homogenize the far field pattern of the optical fiber output may be about $\alpha' = \theta_1/4(n-1)$ as discussed above.

For some such embodiments, $\theta_1$ may be equal to the pitch of the beams before the focusing optic divided by the focal length of the focusing optic.

FIGS. 10-13 illustrate embodiments of a means for homogenizing a far field pattern 10 of an optical conduit 24 coupled to discrete emitter beams 46. FIGS. 10 and 11 illustrate an optical conduit embodiment 24 that may be incorporated into the optical system 20 of FIGS. 2 and 3. The optical system 20 after incorporation may include a plurality of linearly spaced emitters 42 configured to generate a respective plurality of substantially parallel equally spaced output beams 46 along output axes 44 of the respective emitters in a symmetrical distribution about a center output axis 62 of a center emitter. A focusing optic 32 may be operatively coupled to the plurality of emitters 42 and configured to focus a plurality of substantially parallel output beams 46 from the emitters. The optical conduit 24 includes a transmitting core 68 and may have an input surface 37 that is operatively coupled to an output axis and focal region of the focusing optic 32. The optical conduit 24 may also include a longitudinal axis 66 disposed substantially parallel to the center output axis of the center emitter. The input surface 37 of the optical conduit 24 has two facets 76 in a convex chisel-like configuration forming input angles α which are measured between each respective facet surface 76 and a plane 72 that is orthogonal to the longitudinal axis 66 of the optical conduit 24. For such an embodiment, homogenization of the far field pattern 10 may require a proper rotational orientation of the optical fiber 24 about a longitudinal axis 66 of the optical fiber 24. In particular, the input angles α may lie substantially in a plane defined by the beams 46 incident on the optical conduit and focusing optic 32. The input angles α may have a magnitude of about $$\theta_1/4(n-1)$$

wherein $\theta_1$ is the angle formed between adjacent emitter beam axes 44 of beams 46 between the focusing optic 32 and the input 37 of the optical conduit 24 and n is the index of refraction of the transmitting core 68. For some embodiments, the angle formed between adjacent emitter axes 44 between the focusing optic 32 and the input 37 of the optical conduit 24 is substantially equal to the pitch P between adjacent emitters 42 divided by the focal length of the focusing optic 32. For some embodiments, the input angles α may be from about 0.8 degrees to about 2 degrees. Some system embodiments 20 also include a fast axis collimator 26, a slow axis collimator 28 or both which may be operatively coupled to the beam axes 44. The fast axis collimator 26 may be configured to substantially collimate the output of each emitter 42 in a fast axis direction and the slow axis collimator 28 may be configured to substantially collimate the output of each emitter 42 in a slow axis direction.

FIGS. 12 and 13 illustrate an embodiment similar to that of FIGS. 10 and 11, except that the faceted chisel-like input surface 37 of the optical fiber 24 has a concave chisel-like configuration. Such an arrangement may also be incorporated into the optical system 20 shown in FIGS. 2 and 3. The optical system as incorporated may include a plurality of linearly spaced emitters 42 configured to generate a respective plurality of substantially parallel equally spaced output beams 46 along output axes 44 of the respective emitters 42 in a symmetrical distribution about a center output axis of a center emitter. A focusing optic 32 may be operatively coupled to the plurality of emitters 42 and configured to focus a plurality of substantially parallel output beams 46 from the emitters 42. An optical conduit 24 including a transmitting core 68 may have an input surface 37 that is operatively coupled to an output axis and focal region of the focusing optic 32. The optical conduit 24 may also include a longitudinal axis 66 disposed substantially parallel to the center output axis of the center emitter. The input surface 37 of the optical conduit 24 has two facets 76 in a concave chisel-like configuration forming input angles α which are measured between each respective facet surface 76 and a plane 72 that is orthogonal to the longitudinal axis 66 of the optical conduit 24. For such an embodiment, homogenization of the far field pattern 10 may require a proper rotational orientation of the optical fiber 24 about a longitudinal axis 66 of the optical fiber 24. In particular, the input angles α may lie substantially in a plane defined by the beams 46 incident on the optical conduit 24 and disposed between the focusing optic 32 and the optical conduit 24. The input angles α may have a magnitude of about $$\theta_1/4(n-1)$$

wherein $\theta_1$ is the angle formed between adjacent emitter beam axes 44 of beams 46 between the focusing optic 32 and the input 37 of the optical conduit 24 and n is the index of refraction of the transmitting core 68. For some embodiments, the angle $\theta_1$ formed between adjacent emitter axes 44 between the focusing optic 32 and the input 37 of the optical conduit 24 is substantially equal to the pitch P between adjacent emitters 42 divided by the focal length of the focusing optic 32. For some embodiments, the input angles α may be from about 0.8 degrees to about 2 degrees. Some system embodiments 20 also include a fast axis collimator 26, a slow axis collimator 28 or both which may be operatively coupled to the beam axes 44. The fast axis collimator 26 may be configured to substantially collimate the output of each emitter 42 in a fast axis direction and the slow axis collimator may be configured to substantially collimate the output of each emitter 42 in a slow axis direction.

Figure 14:
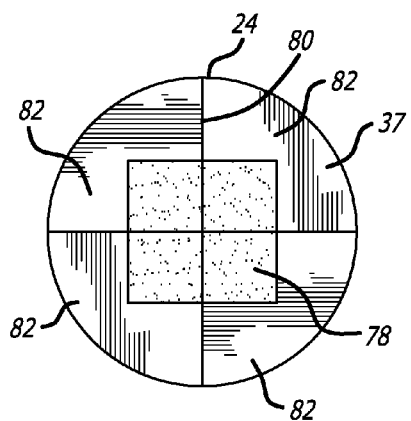
FIG. 14 is an end view of an optical fiber having a pyramid shaped input surface with four facets and an outline of a square shaped incident beam shown on the input surface.
Figure 15:
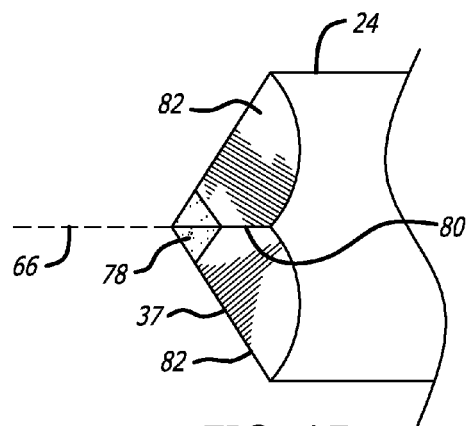
FIG. 15 is an elevation cut away view of the input section of the optical fiber of FIG. 14.
Figure 16:
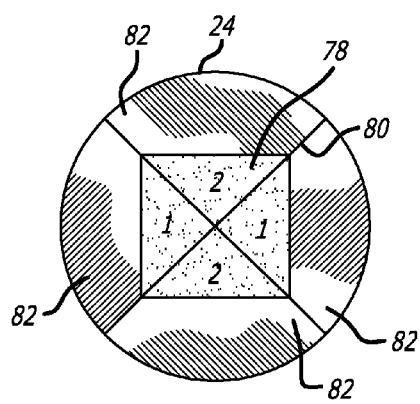
FIG. 16 is an end view of an optical fiber having a pyramid shaped input surface with four facets and an outline of a square shaped incident beam shown on the input surface.
Figure 17:
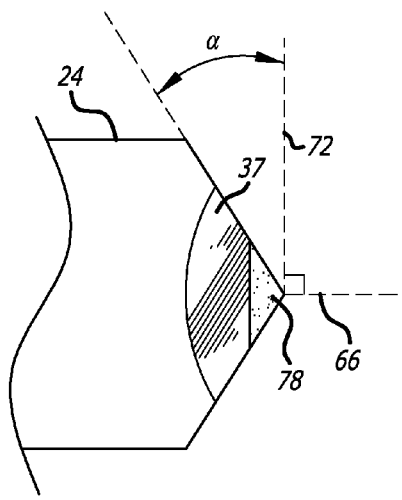
FIG. 17 is an elevation cut away view of the input section of the optical fiber of FIG. 16.

FIGS. 14-17 illustrate embodiments of a means for homogenizing a far field pattern 10 of an optical conduit 24 coupled to discrete emitter beams 46. FIGS. 14 and 15 illustrate an optical conduit embodiment 24 that may be incorporated into the optical system 20 of FIGS. 2 and 3. FIG. 14 illustrates an end view of the input surface 37 of the optical fiber embodiment 24 with an outline of a square shaped incident laser beam 78 shown of the faceted input surface 37. For the embodiment shown in FIGS. 14 and 15, the square outline 78 of the substantially focused beam has corners disposed between or substantially equally spaced between facet boundaries 80 of the input surface. FIGS. 16 and 17 illustrate the optical conduit 24 of FIGS. 14 and 15, but with the corners of the square outline 78 of the substantially focused input beam substantially aligned with the facet boundaries 80 of the input surface 37.

The optical system 20 as incorporated may include a plurality of linearly spaced emitters 42 configured to generate a respective plurality of substantially parallel equally spaced output beams 46 along output axes 44 of the respective emitters 42 in a symmetrical distribution about a center output axis 62 of a center emitter. The focusing optic 32 may be operatively coupled to the plurality of emitters 42 and configured to focus a plurality of substantially parallel output beams 46 from the emitters 42. The optical conduit 24 may include a transmitting core 68 having an input surface 37 that is operatively coupled to an output axis and focal region of the focusing optic 32. The transmitting core 68 may have a longitudinal axis 66 which is disposed substantially parallel to the center output axis 62 of the center emitter. The input surface 37 of the optical conduit 24 may include four facets 82 in a convex trocar-like configuration forming input angles α which are measured between each respective facet surface 82 and a plane 72 that is orthogonal to the longitudinal axis 66 of the optical conduit core, as shown in FIG. 17. In some instances, achieving a substantially homogenous far field pattern 10 for this type of arrangement is less dependent upon the angular orientation of the optical fiber 24 and input surface 37 thereof. However, there is still some rotational orientation dependence. This relatively weak rotational dependence occurs because only the areas of the beam input spot indicated by the number "1" in FIG. 16 contribute to beam homogenization. These facets indicated by the number "1" in FIG. 16 have input angles that lie in the plane formed by the input beams.

For such an embodiment, the input angles α may have a magnitude of about $$\theta_1/4(n-1)$$

wherein $\theta_1$ is the angle formed between adjacent emitter beam axes 44 of beams 46 between the focusing optic 32 and the input surface 37 of the optical conduit 24 and n is the index of refraction of the transmitting core 68. For some embodiments, the angle $\theta_1$ formed between adjacent emitter axes 44 between the focusing optic 32 and the input surface 37 of the optical conduit 24 is substantially equal to the pitch P between adjacent emitters 42 divided by the focal length of the focusing optic 32. For some embodiments, the input angles α may be from about 1 degree to about 3 degrees. Some system embodiments 20 also include a fast axis collimator 26, a slow axis collimator 28 or both which may be operatively coupled to the beam axes 44. The fast axis collimator 26 may be configured to substantially collimate the output of each emitter 42 in a fast axis direction and the slow axis collimator 28 may be configured to substantially collimate the output of each emitter 42 in a slow axis direction.

Figure 18:
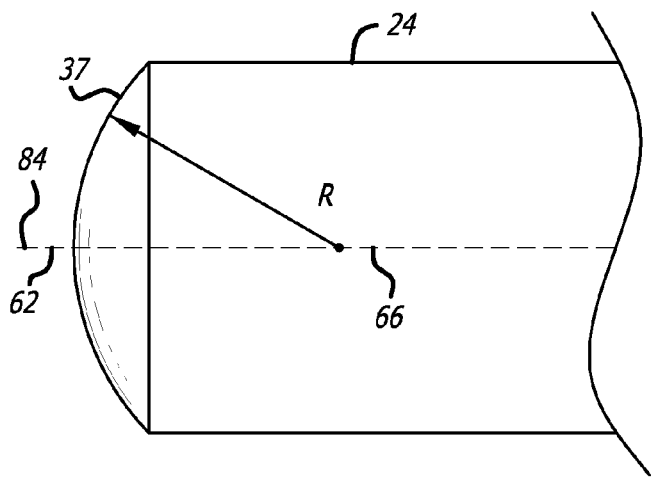
FIG. 18 is an elevation cut away view of an input section of an optical fiber having a convex spherical input surface configuration.
Figure 19:
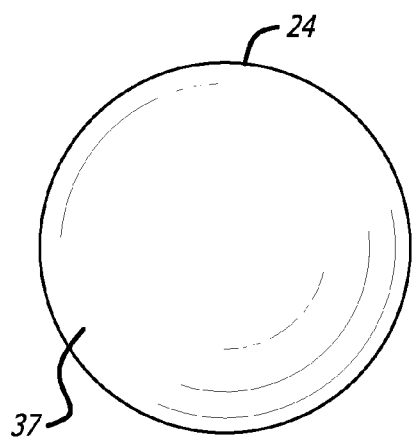
FIG. 19 is an end view of an input surface of the optical fiber of FIG. 18.

FIGS. 18-21 illustrate embodiments of a means for homogenizing a far field pattern 10 of an optical conduit 24 coupled to discrete emitter beams 46 that include optical fibers 24 having rounded input surfaces 37. FIGS. 18 and 19 illustrate an optical conduit embodiment 24 that may be incorporated into the optical system 20 of FIGS. 2 and 3. The optical system 20 as incorporated may include a plurality of linearly spaced emitters 42 configured to generate a respective plurality of substantially parallel equally spaced output beams 46. The output beams 46 may be generated and propagate along output axes 44 of the respective emitters 42 in a symmetrical distribution about a center output axis 62 of a center emitter. The optical system 20 may also include a focusing optic 32 operatively coupled to the plurality of emitters 42. The focusing optic 32 may be configured to focus or otherwise condense the plurality of substantially parallel output beams 46. The optical conduit 24 may have a transmitting core 68 and may be disposed adjacent the focusing optic 32. The optical conduit 24 may have a longitudinal axis 66 that is substantially parallel to a beam axis 62 of a center beam of the laser emitter bar 22. The input surface 37 of the optical conduit embodiment 24 may be operatively coupled to an output axis and focal region of the focusing optic 32 such that the beams 46 of the laser emitter bar 22 are focused or substantially focused onto the input surface embodiment 37 of the optical conduit 24 during operation of the incorporated system 20. Some system embodiments 20 may also include a fast axis collimator 26, a slow axis collimator 28 or both which may be operatively coupled to the beam axes 44. The fast axis collimator 26 may be configured to substantially collimate the output of each emitter 42 in a fast axis direction and the slow axis collimator 28 may be configured to substantially collimate the output of each emitter in a slow axis direction.

Figure 7A:
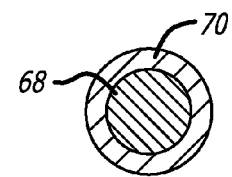
FIG. 7A is a transverse cross section of the optical fiber of FIG. 7 taken along lines 7A-7A of FIG. 7.

The input surface 37 of the optical conduit 24 may include a convex rounded configuration that may have an optical axis 84 or surface apex that is substantially centered on the input surface 37 or aligned with a longitudinal axis 66 of the optical conduit. The convex rounded configuration of the input surface may be substantially symmetrical with respect to the optical axis of the input surface 84 or longitudinal axis 66 of the core of the optical conduit 24, for some embodiments. In some instances, the optical conduit may be an optical fiber 24, such as a multimode optical fiber having a core 68 and cladding 70 with a step index configuration, such as is shown in FIG. 7A. For some such embodiments, the rounded configuration of the input surface 37 of the optical fiber 24 may be formed from material of the transmitting core 68 of the optical fiber 24. In some cases, the rounded convex input surface 37 may be formed by heating and melting the core material 68 of the optical fiber 24 and allowing the melted core material to form into a rounded shape due to the surface tension and cohesion of the melted core material. Such a technique may be used for optical fibers 24 having a core material of glass, silica or the like. The heat for such a melting technique may be supplied by laser energy incident on the input surface 37 of the optical fiber 24 which has a wavelength that is absorbed by the core material 68 of the optical fiber 24.

For some embodiments, the rounded configuration of the input surface 37 of the optical conduit 24 may be formed from material separate from the transmitting core 68 and may be secured in operative arrangement to the transmitting core 68. In some instances, the rounded configuration of the input surface 37 of the optical conduit 24 includes a substantially spherical configuration or partially spherical section. Rounded configurations having the shape of a substantially spherical section may have a radius of curvature R of about 300 microns to about 900 microns for some embodiments, other embodiments may have a radius of curvature R of about 400 microns to about 1200 microns. For some embodiments, the optical conduit 24 may include a multimode optical fiber 24 having a core 68 with a transverse dimension or diameter of about 50 microns to about 400 microns.

Figure 20:
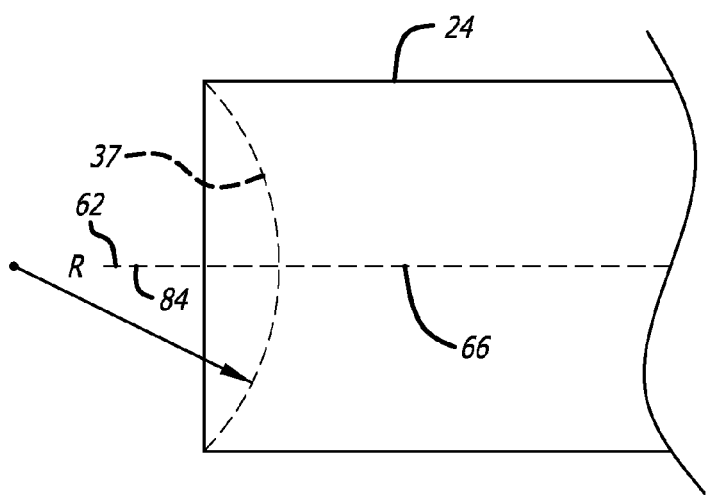
FIG. 20 is an elevation cut away view of an input section of an optical fiber having a concave spherical input surface configuration.
Figure 21:
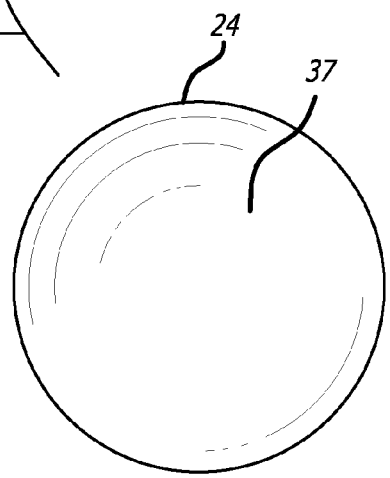
FIG. 21 is an end view of an input surface of the optical fiber of FIG. 20.

FIGS. 20 and 21 illustrate an embodiment of an optical fiber 24 similar in some respects to the embodiment of FIGS. 18 and 19, except that a concave rounded input surface configuration is used instead of the rounded convex input surface of the optical fiber 24. An optical fiber embodiment 24 as shown in FIGS. 18 and 19 may also be incorporated into the optical system 20 as shown in FIGS. 2 and 3. The optical system 20 with the optical fiber embodiment 24 so incorporated may include a plurality of linearly spaced emitters 42 configured to generate a respective plurality of substantially parallel equally spaced output beams 46. The output beams 46 are generated by the laser emitter bar 22 and propagate along output axes 44 of the respective emitters 42 in a symmetrical distribution about a center output axis 62 of a center emitter. The optical system 20 also includes a focusing optic 32 operatively coupled to the plurality of emitters 42. The focusing optic 32 is configured to focus or otherwise condense the plurality of substantially parallel output beams 46. The optical conduit 24 may include a transmitting core. The optical conduit 24 may also be disposed adjacent the focusing optic 32 in the optical train of the system 20. The optical conduit 24 includes an input surface 37 which is operatively coupled to an output axis and focal region of the focusing optic 32. The input surface 37 includes a concave rounded configuration that may have an optical axis 84 that is substantially centered on the input surface 37 or aligned with a longitudinal axis 66 of the optical conduit 24. Some system embodiments also include a fast axis collimator 26, a slow axis collimator 28 or both which may be operatively coupled to the beam axes. The fast axis collimator 26 may be configured to substantially collimate the output of each emitter in a fast axis direction and the slow axis collimator 28 may be configured to substantially collimate the output of each emitter in a slow axis direction.

For some embodiments, the concave rounded configuration of the input surface 37 of the optical conduit 24 may be formed into the material of the transmitting core 68 of the optical conduit 24. For some embodiments, the concave rounded configuration of the input surface 37 of the optical conduit 24 may be formed into material separate from the transmitting core 68 and may be secured in operative arrangement to the transmitting core 68. In some instances, the rounded configuration of the rounded input surface 37 of the optical conduit 24 comprises a substantially spherical configuration or partial spherical section. Rounded configurations having the shape of a substantially spherical section may have a radius of curvature R of about 300 microns to about 900 microns for some embodiments.

Figure 22:
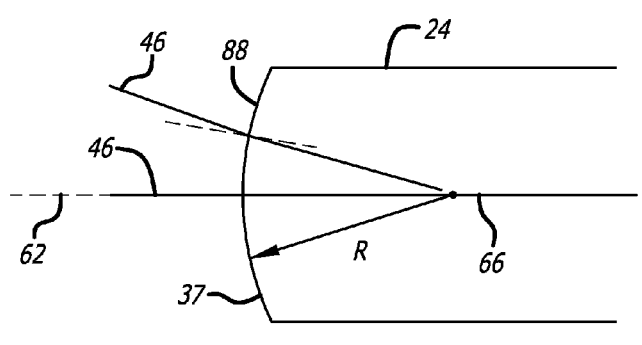
FIG. 22 is an elevation cut away view of an input section of an optical fiber having a convex cylindrically lensed input surface configuration.
Figure 23:
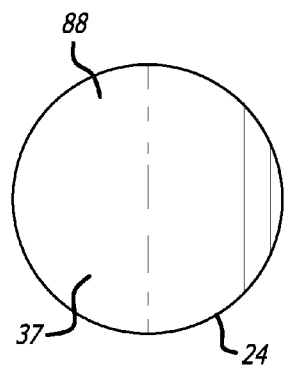
FIG. 23 is an end view of an input surface of the optical fiber of FIG. 22.

FIGS. 22-25 illustrate embodiments of a means for homogenizing a far field pattern 10 of an optical conduit 24 coupled to discrete emitter beams. FIGS. 22 and 23 illustrate an optical conduit embodiment 24 having a convex substantially cylindrical surface formed into an input surface 37 thereof that may be incorporated into the optical system 20 of FIGS. 2 and 3. The optical system 20 as incorporated may include a plurality of linearly spaced emitters 42 configured to generate a respective plurality of substantially parallel equally spaced output beams 46. The output beams 46 are generated by the laser emitter bar 22 and propagate along output axes 44 of the respective emitters 42 in a symmetrical distribution about a center output axis 62 of a center emitter. The optical system 20 also includes a focusing optic 32 operatively coupled to the plurality of emitters 42. The focusing optic 32 may be configured to focus or otherwise condense the plurality of substantially parallel output beams 46. The optical conduit 24 includes a transmitting core 68. The optical conduit 24 may also be disposed adjacent the focusing optic 32. Some system embodiments 20 also include a fast axis collimator 26, a slow axis collimator 28 or both which may be operatively coupled to the beam axes 44. The fast axis collimator 26 may be configured to substantially collimate the output of each emitter in a fast axis direction and the slow axis collimator 28 may be configured to substantially collimate the output of each emitter in a slow axis direction.

The input surface 37 of the optical conduit 24 is operatively coupled to an output axis and focal region of the focusing optic 32. The input surface 37 may be configured with a convex cylindrical lens element 88 substantially centered on the input surface 37. The cylindrical lens element 88 may have a radius of curvature R which lies substantially in a plane defined by the beams 46 incident on the input surface 37 of the optical conduit 24. This arrangement may be desirable in that the effectiveness of the far field pattern homogenization may require proper rotational orientation of the optical conduit 24 and input surface 37 thereof for such a cylindrical lens element 88. For some embodiments, a longitudinal axis of an imaginary cylinder (not shown) that fits to the surface of the cylindrical lens element 88 is perpendicular to the plane formed by the converging beamlett axes 44 of beams 46 impinging on the optical conduit input surface 37. In particular, if the radius of curvature R of the cylindrical lens element does not lie substantially in the plane defined by the plurality of converging focused beams incident on the input surface, the input surface 37 may not be effective in homogenizing the far field pattern 10 from the optical conduit 24. For some embodiments, the cylindrical lens element 88 of the input surface 37 may have a radius of curvature of about 0.2 mm to about 1.5 mm.

For some embodiments, the convex cylindrical lens element 88 of the input surface 37 of the optical conduit 24 may be formed from material of the transmitting core of the optical conduit 24. For some embodiments, the convex cylindrical lens element 88 of the input surface 37 of the optical conduit 24 may be formed from material separate from the transmitting core 68 and is secured in operative arrangement to the transmitting core 68. In some instances, the convex cylindrical lens element 88 of the input surface 37 of the optical conduit 24 may have a radius of curvature R of about 300 microns to about 900 microns for some embodiments.

Figure 24:
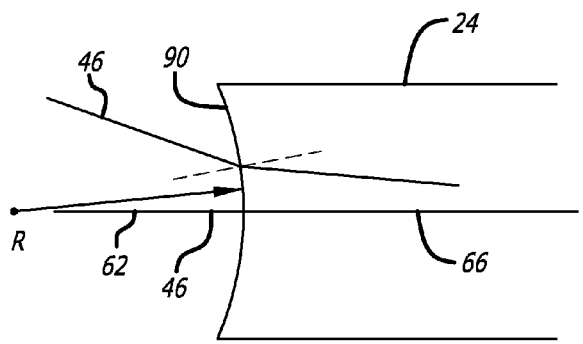
FIG. 24 is an elevation cut away view of an input section of an optical fiber having a concave cylindrically lensed input surface configuration.
Figure 25:
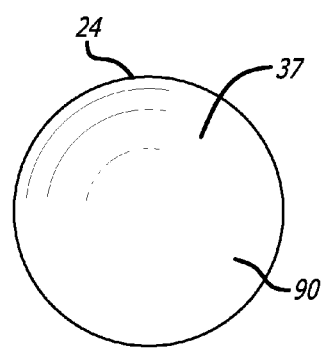
FIG. 25 is an end view of an input surface of the optical fiber of FIG. 24.

FIGS. 24 and 25 illustrate an optical conduit embodiment 24 similar to that of FIGS. 22 and 23, except that the convex cylindrical lens element input surface of the optical fiber has a concave configuration. Such an arrangement may also be incorporated into the optical system 20 shown in FIGS. 2 and 3. The optical system 20 as incorporated with the embodiment of FIGS. 24 and 25 may include a plurality of linearly spaced emitters 42 configured to generate a respective plurality of substantially parallel equally spaced output beams 46. The output beams 46 are generated and propagate along output axes 44 of the respective emitters 42 in a symmetrical distribution about a center output axis of a center emitter. The optical system embodiment 20 also includes a focusing optic 32 operatively coupled to the plurality of emitters 42. The focusing optic 32 is configured to focus or otherwise condense the plurality of substantially parallel output beams 46. The optical conduit 24 includes a transmitting core and may be disposed adjacent the focusing optic 32. Some system embodiments 20 also include a fast axis collimator 26, a slow axis collimator 28 or both which may be operatively coupled to the beam axes 44. The fast axis collimator 26 may be configured to substantially collimate the output of each emitter 42 in a fast axis direction and the slow axis collimator 28 may be configured to substantially collimate the output of each emitter 42 in a slow axis direction.

The optical conduit 24 includes an input surface 37 which is operatively coupled to an output axis and focal region of the focusing optic 32. The input surface 37 includes a concave cylindrical lens element 90 substantially centered on the input surface 37 and having a radius of curvature R lying substantially in a plane defined by the beams 46 incident on the optical conduit 24. In some instances, the concave cylindrical lens element 90 may have a focal length of about 0.2 mm to about 1.5 mm. For some embodiments, the concave cylindrical lens element 90 of the input surface 37 of the optical conduit 24 may be formed into the material of the transmitting core 68 of the optical conduit 24. For some embodiments, the concave cylindrical lens element 90 of the input surface 37 of the optical conduit 24 may be formed into material separate from the transmitting core 68 and may be secured in operative arrangement to the transmitting core 68. In some instances, the concave cylindrical lens element 90 of the input surface 37 of the optical conduit 24 may have a radius of curvature R of about 300 microns to about 900 microns for some embodiments.

Figure 26:
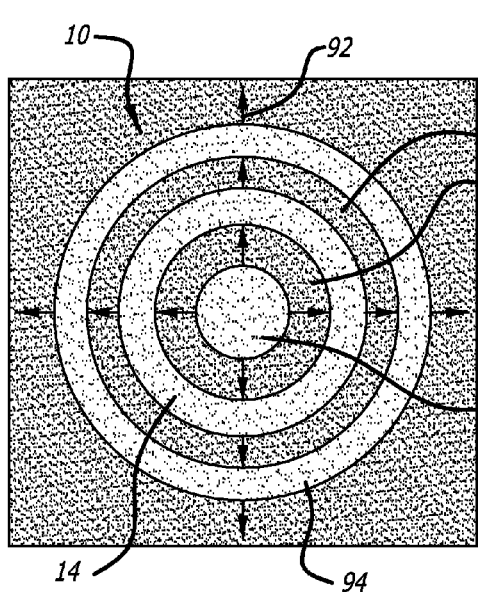
FIG. 26 is a schematic representation of a far field beam output pattern from an optical fiber illustrating a shift direction of high intensity annular regions of the pattern.
Figure 27:
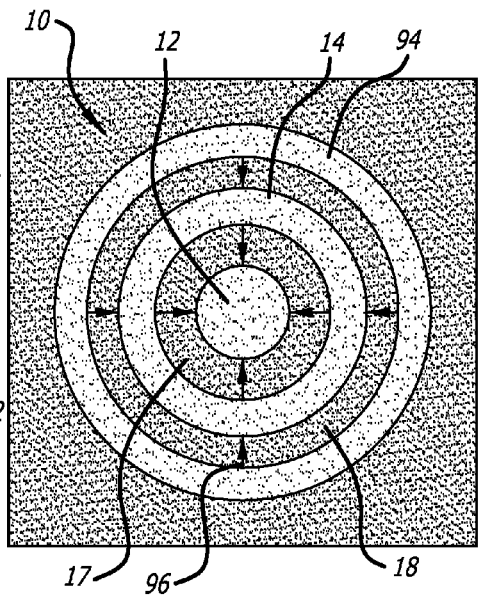
FIG. 27 is a schematic representation of a far field beam output pattern from an optical fiber illustrating a shift direction of high intensity annular regions of the pattern.

Another means for homogenizing the far field pattern 10 of the output of an optical conduit 24 fed with light having discrete input launch angles is to shift the position of hot spots in the far field onto cooler spots or vice versa. FIG. 26 illustrates a schematic representation of a far field beam pattern 10. Also shown in FIG. 26 are arrows 92 which indicate a possible direction of shift of bright rings 12, 14 and 94 in an outward orientation in order to substantially average the intensity distribution by superimposing bright regions or rings 12, 14 or 94, or any combination thereof, in the far field with low intensity regions or rings 17 or 18. FIG. 27 illustrates the same far field pattern 10 but with arrows 96 indicating a shift of bright regions 14 or 94, or both, inwardly in order to average the far field pattern distribution 10. Such shifting of the various discrete regions of the far field pattern may be accomplished by variety of methods. One such method includes shifting the launch angle of some beams 46 into the input surface 37 of the optical conduit 24.

Figure 28:
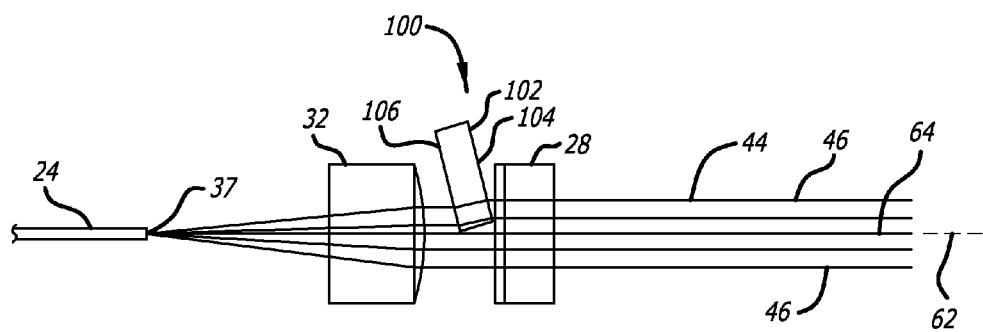
FIG. 28 is a side view of an optical system for coupling multiple parallel beams and including an optical element used to laterally shift the position of beams disposed on one side of the center beam or optical axis of the system.

FIG. 28 illustrates a portion of an optical system 100 that may be incorporated into the optical system 20 shown in FIGS. 2 and 3. Such an optical system 20 may include a plurality of linearly spaced emitters 42 configured to generate a respective plurality of substantially parallel equally spaced output beams 46 along output axes 44 of the respective emitters 42. The beams 46 may be disposed in a symmetrical distribution about a center output axis 62 of a center emitter. The incorporated system 20 may also include a focusing optic 32 operatively coupled to the plurality of emitters 42 and configured to focus a plurality of substantially parallel output beams 46 from the emitters 42. Some system embodiments 20 also include a fast axis collimator 26, a slow axis collimator 28, or both, which may be operatively coupled to the beam axes 44. The fast axis collimator 26 may be configured to substantially collimate the output of each emitter 42 in a fast axis direction and the slow axis collimator 28 may be configured to substantially collimate the output of each emitter 42 in a slow axis direction.

An optical conduit 24 may be included in the system 20 that has a transmitting core 68 with an input surface 37 which is operatively coupled to an output axis and focal region of the focusing optic 32. An optical shift element 102 may be disposed generally between the plurality of emitters 42 and focusing optic 32 or any other suitable location. The optical shift element 102 may be configured to shift the optical axes 44 of the output beams 46 which are on one side of the center output axis 62. For some embodiments, the optical shift element 102 may include a block having a desired thickness and parallel input and output surfaces. The optical shift element 102 may also include a wedge. The optical shift element 102 may be made of a refractive or transmissive optical material such as glass, silica, solid state materials or the like. For some embodiments, the optical shift element 102 may have an input surface 104 which is parallel or substantially parallel to an output surface 106. In some instances, the optical shift element block embodiment 102 may have a thickness of about 0.5 mm to about 2 mm.

As can be seen in the illustration of FIG. 28, the two upper beams 46 passing through the optical shift element 102 are transversely shifted inwardly towards the center beam 64. The two beams which have been laterally shifted inward remain parallel to each other and to the other beams 46 from the laser emitter bar 22 which have not been laterally shifted in position. The amount of transverse shift desired may depend on the particular embodiment and far field pattern that is required. For some embodiments, the amount of inward shift is configured to fill the angular gap between center and center −1 emitters and the angular gap between center −1 and center −2 emitters.

Figure 29:
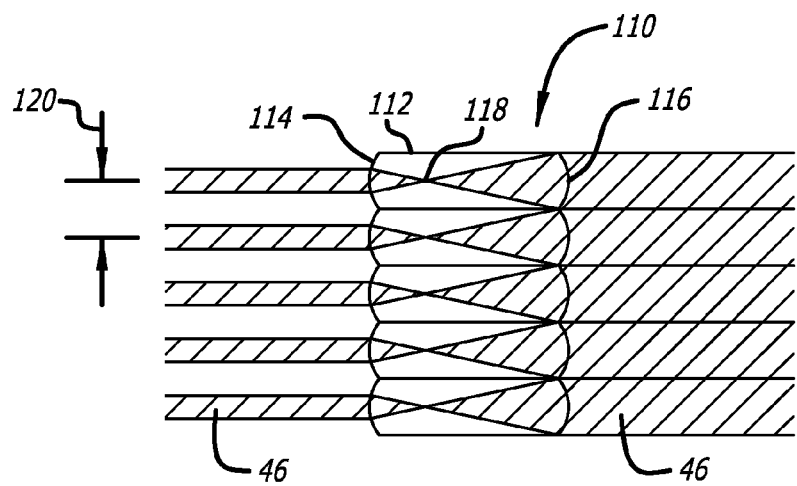
FIG. 29 illustrates an array of Keplerian type telescope elements.

Another embodiment of a means for homogenizing a far field beam pattern 10 from the output of an optical conduit 24 of an optical system 20 may include devices and methods for beam expansion. Beam expansion devices, such as telescopes, may be used to expand each beam 46 from the laser emitter bar 22 to contact or overlap adjacent beams 46 prior to focusing of the beams 46 into the optical conduit 24. FIG. 29 illustrates a top view of an array of Keplerian type telescopes 110 with each telescope element 112 thereof having a convex input lens 114 and convex output lens 116. Each convex input lens 114 is configured to focus a respective beam 46 within the telescope body. The beam 46 is then allowed to expand after the focal point 118 to a width that is larger than the input beam and then recollimated by the convex output lens 116.

Figure 30:
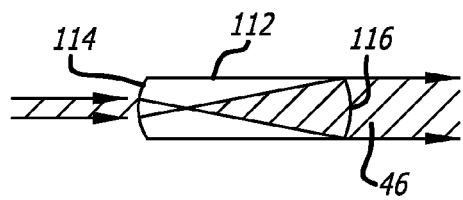
FIG. 30 illustrates a ray trace of a beam being transversely expanded by passing through a single Keplerian type telescope element.

The focal lengths of the convex input lens 114 and convex output lens 116 and separation of these lenses may be configured to expand each respective beam 46 to the lateral boundaries of the telescope structure. The telescopes 112 may also be configured to expand each beam 46 so as to contact, nearly contact or overlap adjacent beams 46 as shown by the beam ray trace in FIG. 29. FIG. 30 illustrates a beam ray trace through a single telescope element 112 of a telescope array 110. The expansion of each beam 46 may be achieved by the telescope elements 112 without adding substantial or significant divergence or convergence of the individual beams 46. For some embodiments, the pitch 120 of the telescope elements 112 of the telescope array 110 may be selected to match the pitch 120 of the laser emitter bar 22, or of the beam array of the beams 46 at the input side of the array of telescope elements 110.

Some system embodiments 20 include a plurality of linearly spaced emitters 42 configured to generate a respective plurality of substantially parallel equally spaced output beams 46. The output beams 46 may be configured to propagate along output axes 44 of the respective emitters 42 in a symmetrical distribution about a center output axis 62 of a center emitter. A focusing optic 32 may be operatively coupled to the plurality of emitters 42 and configured to focus or otherwise condense the plurality of substantially parallel output beams 46 from the emitters 42. An optical conduit 24 having a transmitting core 68 that includes an input surface 37 which is operatively coupled to an output axis and focal region of the focusing optic 32 may also be included in the incorporated system 20. The telescope array 110 may be disposed in operative arrangement within an optical train of the optical system 20 between the plurality of linearly spaced emitters 42 and the focusing optic 32. The telescope array 110 may be configured to expand each beam 46 from the laser emitter bar 22 to contact or overlap adjacent beams 46 prior to focusing of the beams 46 into the optical conduit 24. Some system embodiments also include a fast axis collimator 26, a slow axis collimator 28 or both which may be operatively coupled to the beam axes 44. The fast axis collimator 26 may be configured to substantially collimate the output of each emitter in a fast axis direction and the slow axis collimator 28 may be configured to substantially collimate the output of each emitter 42 in a slow axis direction.

Figure 31:
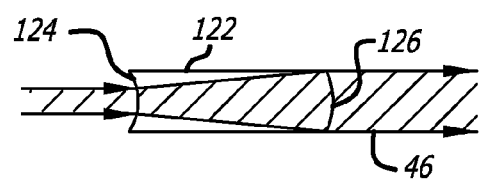
FIG. 31 illustrates a ray trace of a beam being transversely expanded by passing through a single Galilean type telescope element.

Generally, the telescope array 110 may be positioned within the optical train of an optical system 20, such as the optical system 20 illustrated in FIGS. 2 and 3, between the fast axis collimator 26 and focusing optic 32. In some instances, the telescope array 110 may be disposed between an optional beam reformatting optic 34 and a slow axis collimator 28 of the optical system 20. In some embodiments, the telescope array 110 may be so disposed immediately adjacent the optional beam reformatting element or optic 34. For some embodiments, the slow axis collimator 28 may be disposed on either side of the telescope array 110. Although the telescope array 110 shown in FIG. 29 includes an array of Keplerian type telescopes 112, other telescopes, or beam expansion devices generally, may be used. FIG. 31 illustrates a top view of a Galilean type telescope element 122 that may be used in the same manner as discussed above with regard to the array of Keplerian type telescopes. The materials, dimensions, features and arrangement for the Galilean type telescope elements 112 may be the same as or similar to those of the Keplerian telescope elements 122. The telescope element 122 includes a concave input lens 124 and convex output lens 126. The beam 46 expands to the physical limits of the telescope element 122 without going through a focal point.

With regard to the above detailed description, like reference numerals used therein refer to like elements that may have the same or similar dimensions, materials and configurations. While particular forms of embodiments have been illustrated and described, it will be apparent that various modifications can be made without departing from the spirit and scope of the embodiments of the invention. Accordingly, it is not intended that the invention be limited by the forgoing detailed description.

What is claimed is:

1. An optical system, comprising:
 a plurality of linearly spaced emitters configured to generate a respective plurality of substantially parallel equally spaced output beams along output axes of the respective emitters in a symmetrical distribution about a center output axis of a center emitter;

a focusing optic operatively coupled to the plurality of emitters and configured to focus a plurality of substantially parallel output beams from the emitters; and an optical conduit comprising a transmitting core which includes an input surface that is operatively coupled to an output axis and focal region of the focusing optic and which includes a longitudinal axis disposed substantially parallel to the center output axis of the center emitter, the input surface comprising an input angle with respect to a plane that is orthogonal to the longitudinal axis of the optical conduit, the input angle lying which licc, substantially in a plane defined by the beams incident on the optical conduit and which includes a magnitude of about $$\theta_1/4(n-1)$$

wherein $\theta_1$ is the angle formed between adjacent emitter beam axes of beams between the focusing optic and the input of the optical conduit and n is the index of refraction of the transmitting core and wherein the input angle is configured to substantially homogenize a far field pattern of an output of the optical conduit.

2. The system of claim 1 further comprising a beam reformatting optic.

3. The system of claim 2 wherein the beam reformatting optic is configured to rotate each beam about its axis about 80 degrees to about 100 degrees.

4. The system of claim 1 wherein the angle formed between adjacent emitter beam axes between the focusing optic and the input of the optical conduit is substantially equal to the pitch between adjacent emitters divided by the focal length of the focusing optic.

5. The system of claim 1 wherein the input angle is from about 0.8 degrees to about 2 degrees.

6. The system of claim 1 wherein the plurality of linearly spaced emitters comprise a laser emitter bar including a plurality of laser diodes disposed in a linear array.

7. The system of claim 6 wherein the laser emitter bar comprises about 3 to about 15 emitters.

8. The system of claim 1 wherein the optical conduit comprises an optical fiber including a transmitting core.

9. The system of claim 8 wherein the transmitting core of the optical fiber comprises solid material.

10. The system of claim 9 wherein the solid material of the transmitting core comprises glass.

11. The system of claim 8 wherein the optical fiber comprises a multimode optical fiber.

12. The system of claim 1 wherein the plurality of emitters all emit light at substantially the same wavelength.

13. The system of claim 12 wherein the plurality of emitters emit light at a wavelength between about 350 nm to about 2000 nm.

14. An optical system, comprising:

a plurality of linearly spaced emitters configured to generate a respective plurality of substantially parallel equally spaced output beams along output axes of the respective emitters in a symmetrical distribution about a center output axis of a center emitter;

a focusing optic operatively coupled to the plurality of emitters and configured to focus a plurality of substantially parallel output beams from the emitters; and an optical conduit comprising a transmitting core which includes an input surface that is operatively coupled to an output axis and focal region of the focusing optic and which includes a longitudinal axis disposed substantially parallel to the center output axis of the center emitter, the input surface comprising:

two facets in a chisel-like configuration forming respective input angles which are measured between each respective facet surface and a plane that is orthogonal to the longitudinal axis, which lie the input angles lying substantially in a plane defined by the beams incident on the optical conduit and including a magnitude of about $$\theta_1/4(n-1)$$

wherein $\theta_1$ is the angle formed between adjacent emitter beam axes of beams between the focusing optic and the input of the optical conduit and n is the index of refraction of the transmitting core and wherein the input angles are configured to substantially homogenize a far field pattern of an output of the optical conduit.

15. The system of claim 14 further comprising a beam reformatting optic.

16. The system of claim 15 wherein the beam reformatting optic is configured to rotate each beam about its axis about 80 degrees to about 100 degrees.

17. The system of claim 14 wherein the angle formed between adjacent emitter axes between the focusing optic and the input of the optical conduit is substantially equal to the pitch between adjacent emitters divided by the focal length of the focusing optic.

18. The system of claim 14 wherein the facets comprise a convex chisel configuration.

19. The system of claim 14 wherein the facets comprise a concave chisel configuration.

20. The system of claim 14 wherein the input angles are from about 0.8 degrees to about 2 degrees.

21. The system of claim 14 wherein the plurality of linearly spaced emitters comprise a laser emitter bar including a plurality of laser diodes disposed in a linear array.

22. The system of claim 21 wherein the laser emitter bar comprises about 3 to about 15 emitters.

23. The system of claim 14 wherein the optical conduit comprises an optical fiber including a transmitting core.

24. The system of claim 23 wherein the transmitting core of the optical fiber comprises solid material.

25. The system of claim 24 wherein the solid material of the transmitting core comprises glass.

26. The system of claim 23 wherein the optical fiber comprises a multimode optical fiber.

27. The system of claim 14 wherein the plurality of emitters all emit light at substantially the same wavelength.

28. The system of claim 27 wherein the plurality of emitters emit light at a wavelength between about 350 nm to about 2000 nm.

29. An optical system, comprising:

a plurality of linearly spaced emitters configured to generate a respective plurality of substantially parallel equally spaced output beams along output axes of the respective emitters in a symmetrical distribution about a center output axis of a center emitter;

a focusing optic operatively coupled to the plurality of emitters and configured to focus a plurality of substantially parallel output beams from the emitters; and an optical conduit comprising a transmitting core which includes an input surface that is operatively coupled to an output axis and focal region of the focusing optic and which includes a longitudinal axis disposed substantially parallel to the center output axis of the center emitter, the input surface comprising:

four facets in a convex pyramid shaped configuration forming input angles which are measured between each respective facet surface and a plane that is orthogonal to the longitudinal axis and which include a magnitude of about $$\theta_1/4(n-1)$$

wherein $\theta_1$ is the angle formed between adjacent emitter beam axes of beams between the focusing optic and the input of the optical conduit and n is the index of refraction of the transmitting core and wherein the input angles are configured to substantially homogenize a far field pattern of an output of the optical conduit.

30. The system of claim 29 further comprising a beam reformatting optic.

31. The system of claim 30 wherein the beam reformatting optic is configured to rotate each beam about its axis about 80 degrees to about 100 degrees.

32. The system of claim 29 wherein the angle formed between adjacent emitter axes between the focusing optic and the input of the optical conduit is substantially equal to the pitch between adjacent emitters divided by the focal length of the focusing optic.

33. The system of claim 29 wherein the input angles are from about 0.8 degrees to about 2 degrees.

34. The system of claim 29 wherein the plurality of linearly spaced emitters comprise a laser emitter bar including a plurality of laser diodes disposed in a linear array.

35. The system of claim 34 wherein the laser emitter bar comprises about 3 to about 15 emitters.

36. The system of claim 29 wherein the optical conduit comprises an optical fiber including a transmitting core.

37. The system of claim 36 wherein the transmitting core of the optical fiber comprises solid material.

38. The system of claim 37 wherein the solid material of the transmitting core comprises glass.

39. The system of claim 36 wherein the optical fiber comprises a multimode optical fiber.

40. The system of claim 29 wherein the plurality of emitters all emit light at substantially the same wavelength.

41. The system of claim 40 wherein the plurality of emitters emit light at a wavelength between about 350 nm to about 2000 nm.

42. An optical system, comprising:
a plurality of linearly spaced emitters configured to generate a respective plurality of substantially parallel equally spaced output beams along output axes of the respective emitters in a symmetrical distribution about a center output axis of a center emitter;
a focusing optic operatively coupled to the plurality of emitters and configured to focus a plurality of substantially parallel output beams from the emitters; and
an optical conduit comprising a transmitting core that includes an input surface which is operatively coupled to an output axis and focal region of the focusing optic and which includes a rounded configuration substantially centered on the input surface and wherein the rounded configuration of the input surface is configured to substantially homogenize a far field pattern of an output of the optical conduit.

43. The system of claim 42 further comprising a beam reformatting optic.

44. The system of claim 43 wherein the beam reformatting optic is configured to rotate each beam about its axis about 80 degrees to about 100 degrees.

45. The system of claim 42 wherein the rounded configuration of the input surface of the optical conduit comprises a convex configuration.

46. The system of claim 42 wherein the rounded configuration of the input surface of the optical conduit comprises a concave configuration.

47. The system of claim 42 wherein the rounded configuration of the input surface of the optical conduit comprises a substantially spherical configuration.

48. The system of claim 42 wherein a radius of curvature of the spherical configuration of the input surface of the optical conduit is about 400 microns to about 1200 microns.

49. The system of claim 42 wherein the rounded configuration of the input surface of the optical conduit is formed from material of the transmitting core.

50. The system of claim 42 wherein the rounded configuration of the input surface of the optical conduit is formed from material separate from the transmitting core and is secured in operative arrangement to the transmitting core.

51. The system of claim 42 wherein the plurality of linearly spaced emitters comprise a laser emitter bar including a plurality of laser diodes disposed in a linear array.

52. The system of claim 51 wherein the laser emitter bar comprises about 3 to about 15 emitters.

53. The system of claim 42 wherein the optical conduit comprises an optical fiber including a transmitting core.

54. The system of claim 53 wherein the transmitting core of the optical fiber comprises solid material.

55. The system of claim 54 wherein the solid material of the transmitting core comprises glass.

56. The system of claim 53 wherein the optical fiber comprises a multimode optical fiber.

57. The system of claim 42 wherein the plurality of emitters all emit light at substantially the same wavelength.

58. The system of claim 57 wherein the plurality of emitters emit light at a wavelength between about 350 nm to about 2000 nm.

59. An optical system, comprising:
a plurality of linearly spaced emitters configured to generate a respective plurality of substantially parallel equally spaced output beams along output axes of the respective emitters in a symmetrical distribution about a center output axis of a center emitter;
a focusing optic operatively coupled to the plurality of emitters and configured to focus a plurality of substantially parallel output beams from the emitters; and
an optical conduit comprising a transmitting core that includes an input surface which is operatively coupled to an output axis and focal region of the focusing optic and which includes a cylindrical lens element substantially centered on the input surface, having a radius of curvature lying substantially in a plane defined by the beams incident on the optical conduit and configured to substantially homogenize a far field pattern of an output of the optical conduit.

60. The system of claim 59 further comprising a beam reformatting optic.

61. The system of claim 60 wherein the beam reformatting optic is configured to rotate each beam about its axis about 80 degrees to about 100 degrees.

62. The system of claim 59 wherein the cylindrical lens element comprises a convex configuration.

63. The system of claim 59 wherein the cylindrical lens element comprises a concave configuration.

64. The system of claim 59 wherein a radius of curvature of the cylindrical lens element is about 200 microns to about 1500 microns.

65. The system of claim 59 wherein the cylindrical lens element is formed from material of the transmitting core.

66. The system of claim 59 wherein the cylindrical lens element is formed from material separate from the transmitting core and is secured in operative arrangement to the transmitting core.

67. The system of claim 59 wherein the plurality of linearly spaced emitters comprise a laser emitter bar including a plurality of laser diodes disposed in a linear array.

68. The system of claim 67 wherein the laser emitter bar comprises about 3 to about 15 emitters.

69. The system of claim 59 wherein the optical conduit comprises an optical fiber including a transmitting core.

70. The system of claim 69 wherein the transmitting core of the optical fiber comprises solid material.

71. The system of claim 70 wherein the solid material of the transmitting core comprises glass.

72. The system of claim 69 wherein the optical fiber comprises a multimode optical fiber.

73. The system of claim 59 wherein the plurality of emitters all emit light at substantially the same wavelength.

74. The system of claim 73 wherein the plurality of emitters emit light at a wavelength between about 350 nm to about 2000 nm.

\* \* \* \* \*

UNITED STATES PATENT AND TRADEMARK OFFICE
CERTIFICATE OF CORRECTION

| | | |
|---|---|---|
| PATENT NO. | : 9,166,365 B2 | Page 1 of 1 |
| APPLICATION NO. | : 13/522692 | |
| DATED | : October 20, 2015 | |
| INVENTOR(S) | : Sang-Ki Park et al. | |

It is certified that error appears in the above-identified patent and that said Letters Patent is hereby corrected as shown below:

In the claims,

Column 23
    Claim 1, lines 13-14 should read:
        "axis of the optical conduit, the input angle lying
        substantially in a plane defined by the beams inci-"

Column 24
    Claim 14, line 6 should read:
        "longitudinal axis, the input angles lying sub-"

Column 26
    Claim 48, line 7 should read:
        "48. The system of claim 47 wherein a radius of curvature of"

Signed and Sealed this
Twenty-sixth Day of April, 2016

Michelle K. Lee
*Director of the United States Patent and Trademark Office*